US006894311B2

(12) United States Patent
Maeda et al.

(10) Patent No.: US 6,894,311 B2
(45) Date of Patent: May 17, 2005

(54) ACTIVE MATRIX SUBSTRATE FOR LIQUID CRYSTAL DISPLAY UTILIZING INTERCONNECTION LINES FORMED FROM MULTILAYERED FILMS THAT INCLUDE AN ALUMINUM-NEODYMIUM ALLOY LAYER

(75) Inventors: Akitoshi Maeda, Tokyo (JP); Hiroaki Tanaka, Tokyo (JP); Shigeru Kimura, Tokyo (JP); Satoshi Kimura, Akita (JP)

(73) Assignee: NEC LCD Technologies, Ltd., Kanagawa (JP)

( * ) Notice: Subject to any disclaimer, the term of this patent is extended or adjusted under 35 U.S.C. 154(b) by 24 days.

(21) Appl. No.: 10/151,544

(22) Filed: May 20, 2002

(65) Prior Publication Data

US 2002/0176032 A1 Nov. 28, 2002

(30) Foreign Application Priority Data

May 18, 2001 (JP) ........................................ 2001-150092

(51) Int. Cl.[7] .................. H01L 23/532; H01L 31/0392; G02F 1/1345
(52) U.S. Cl. .......................... 257/66; 257/761; 257/763; 257/764; 257/765; 257/766; 349/43; 349/147
(58) Field of Search .......................... 257/66, 761, 763, 257/764, 765, 766, 771; 349/43, 147

(56) References Cited

U.S. PATENT DOCUMENTS 5,811,835 A * 9/1998 Seiki et al. .................... 257/57
5,912,506 A * 6/1999 Colgan et al. .............. 257/750
6,037,017 A * 3/2000 Kashiro ....................... 427/579
6,081,308 A * 6/2000 Jeong et al. .................. 349/42
6,255,706 B1 * 7/2001 Watanabe et al. ........... 257/412
6,317,185 B1 * 11/2001 Harano et al. .............. 349/147
6,433,842 B1 * 8/2002 Kaneko et al. ............... 349/43
2001/0048499 A1 * 12/2001 Numano et al. ............ 349/123
2003/0098939 A1 * 5/2003 Min et al. ................... 349/141

FOREIGN PATENT DOCUMENTS

| JP | 9-171197 | 6/1997 |
|---|---|---|
| JP | 9-197433 | 7/1997 |
| JP | 2000-47240 | 2/2000 |
| JP | 2000-164886 | 6/2000 |
| JP | 2000-275679 | 10/2000 |
| JP | 2000-314897 | 11/2000 |
| KR | 1999-77818 | 10/1999 |
| KR | 2000-33842 | 6/2000 |
| KR | 2000-67121 | 11/2000 |

* cited by examiner

Primary Examiner—Stephen W. Smoot
(74) Attorney, Agent, or Firm—Choate, Hall & Stewart

(57) ABSTRACT

An active matrix substrate comprises a matrix array of TFTs. A double-layered film includes an under-layer of aluminum-neodymium (Al—Nd) alloy and an over-layer of high melting point metal. The double-layered film forms first interconnection lines for connection to the TFTs. A triple-layered film includes an under-layer of said high melting point metal, a middle-layer of said Al—Nd alloy and an over-layer of the high melting point metal. The triple-layered film forms second interconnection lines for connection to the TFTs.

35 Claims, 24 Drawing Sheets

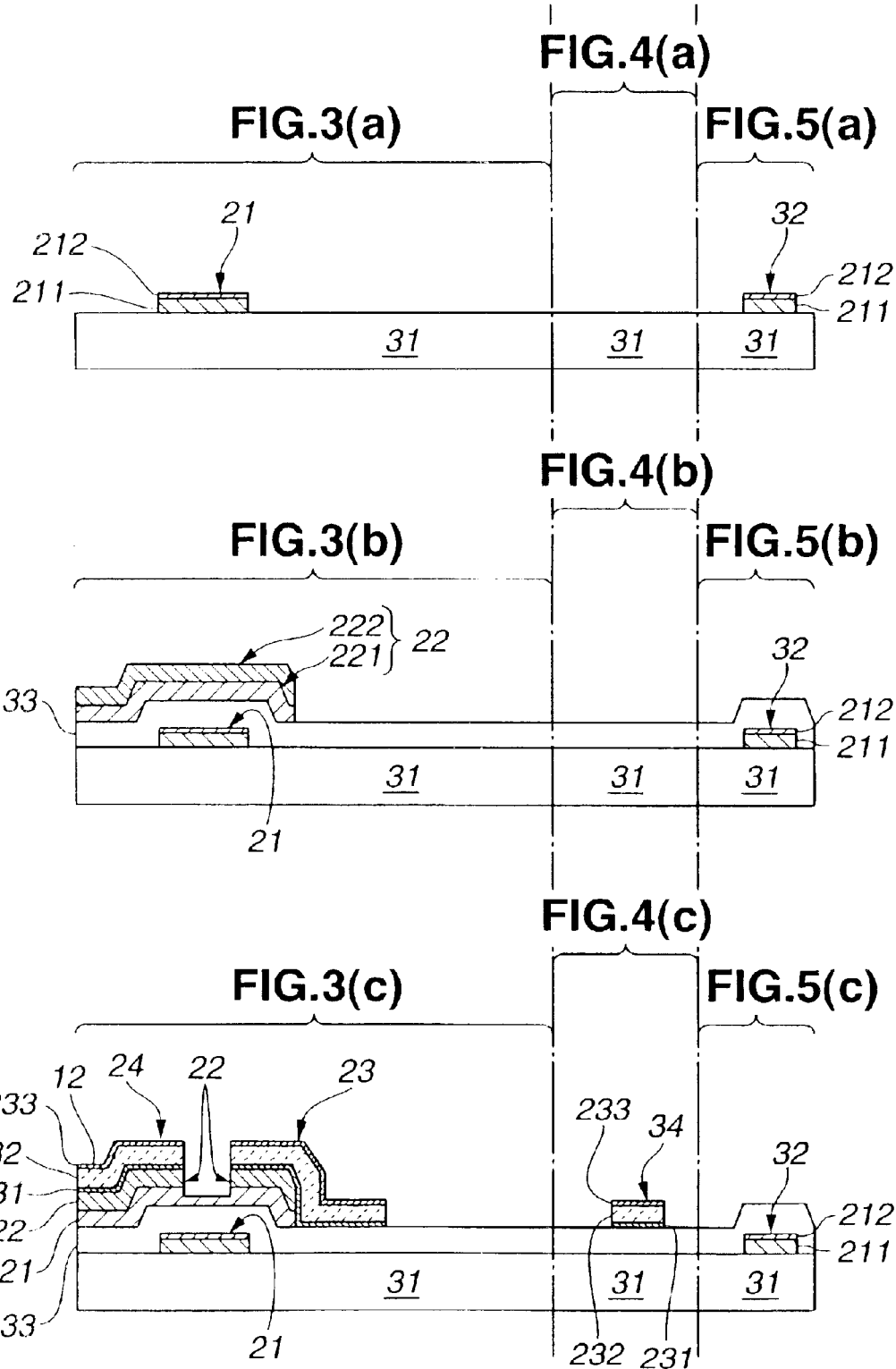

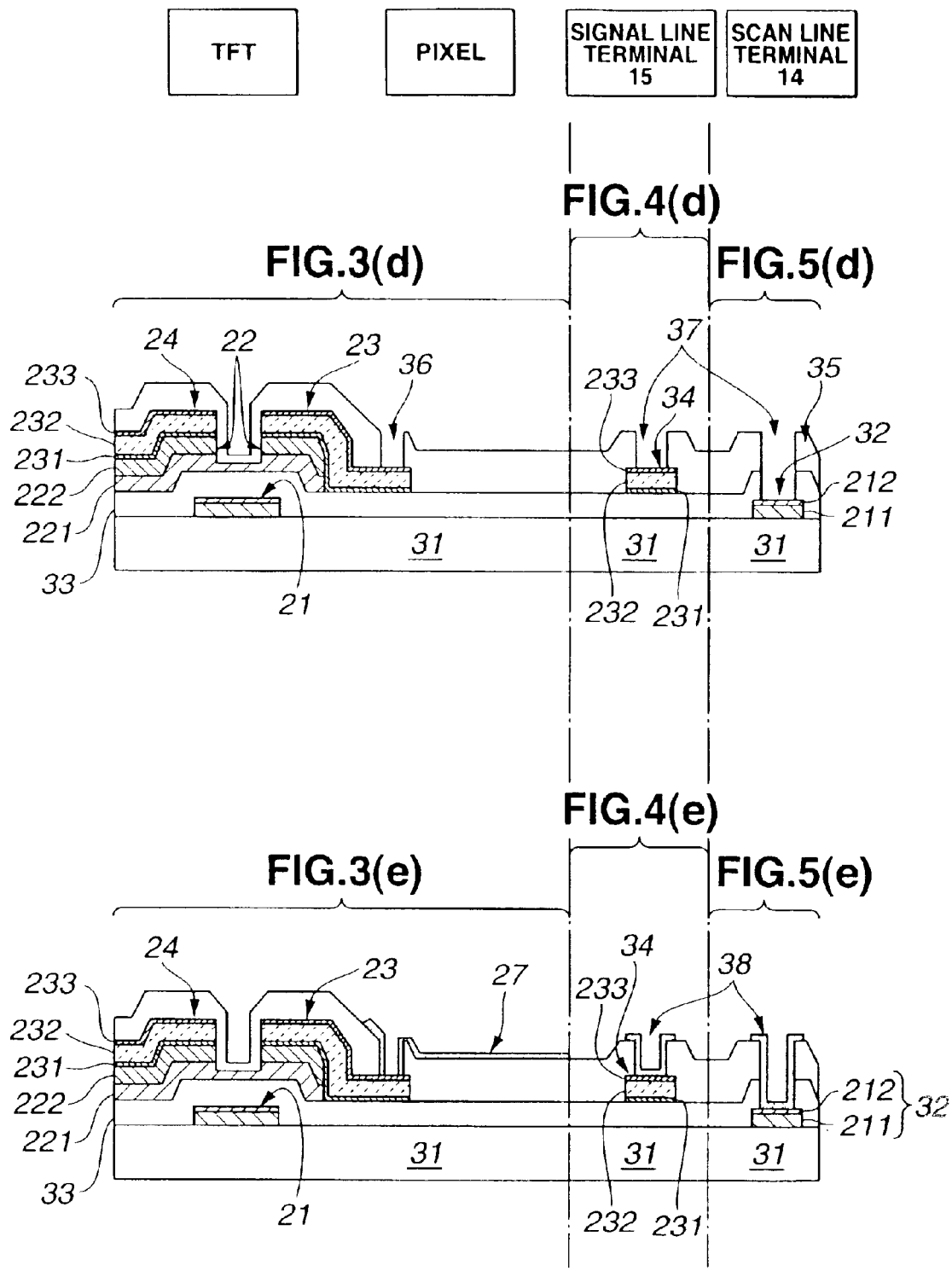

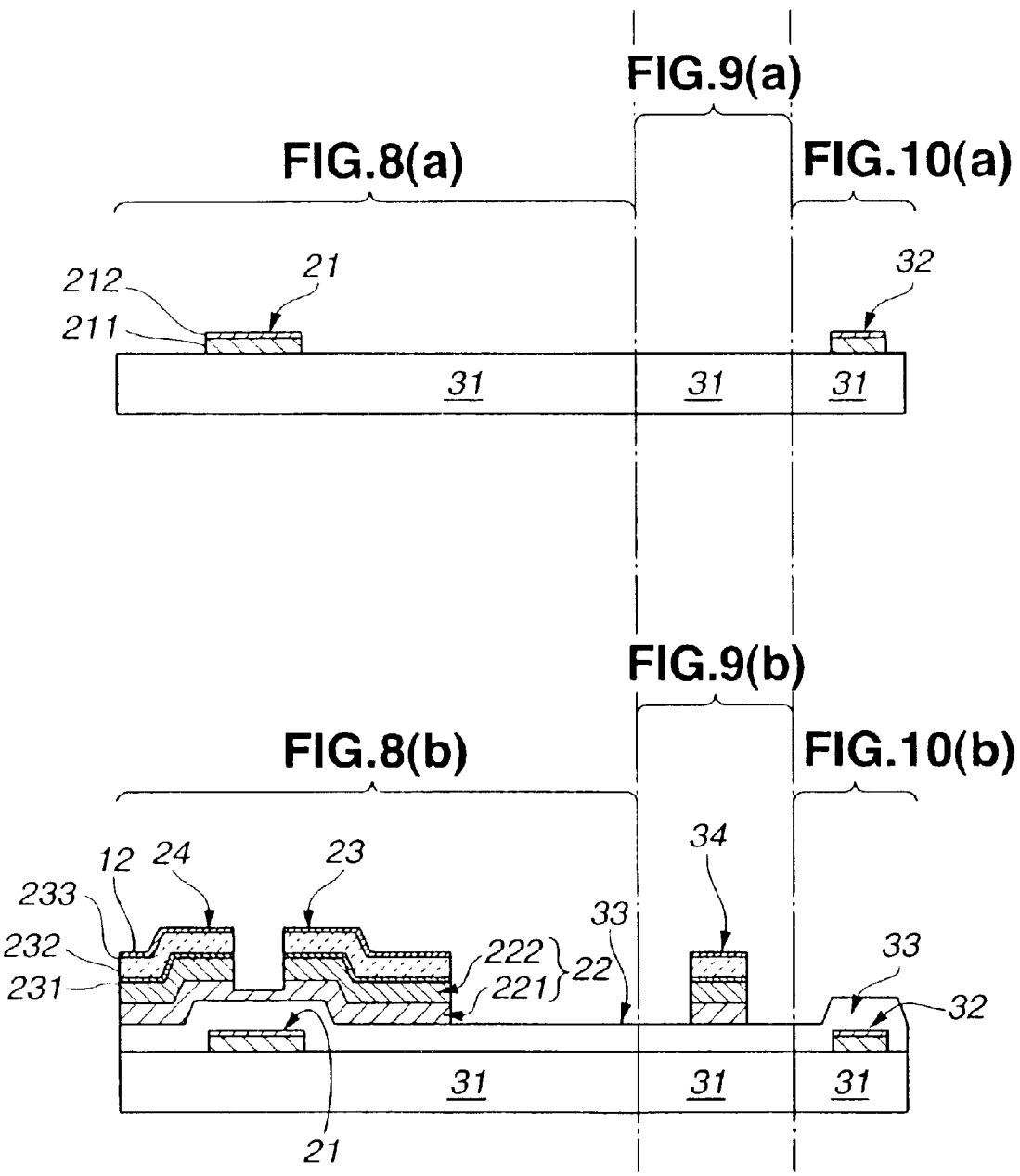

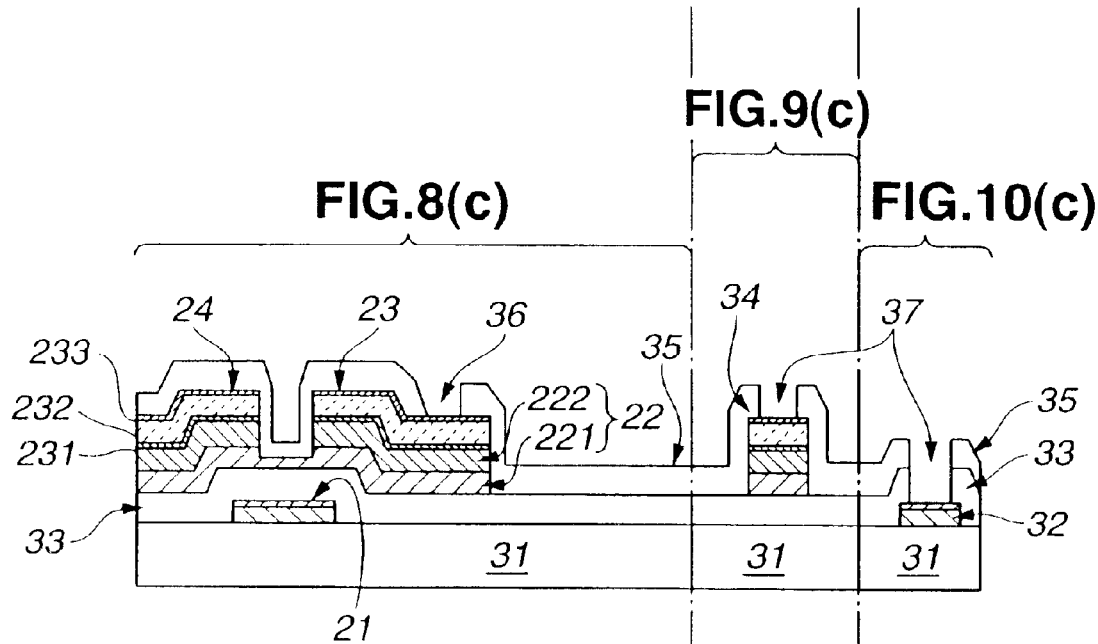
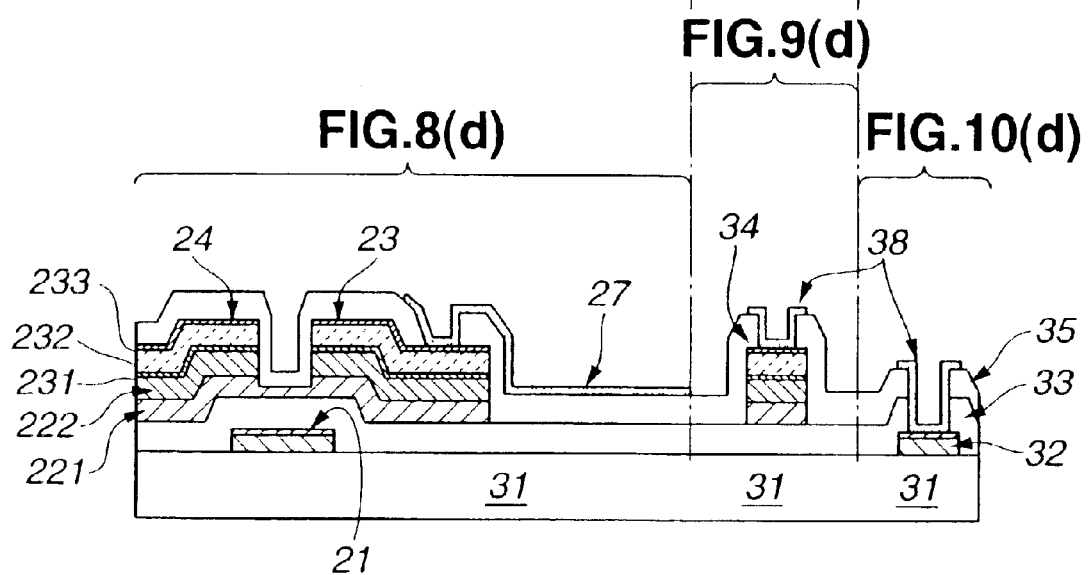

FIG.9(b)-1
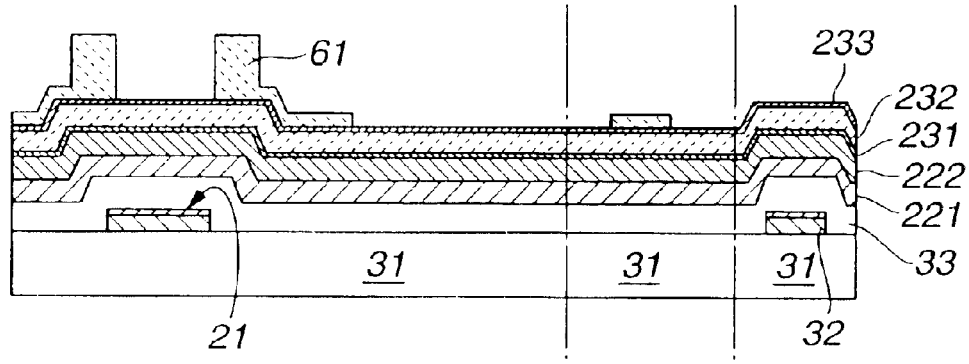
FIG.9(b)-2
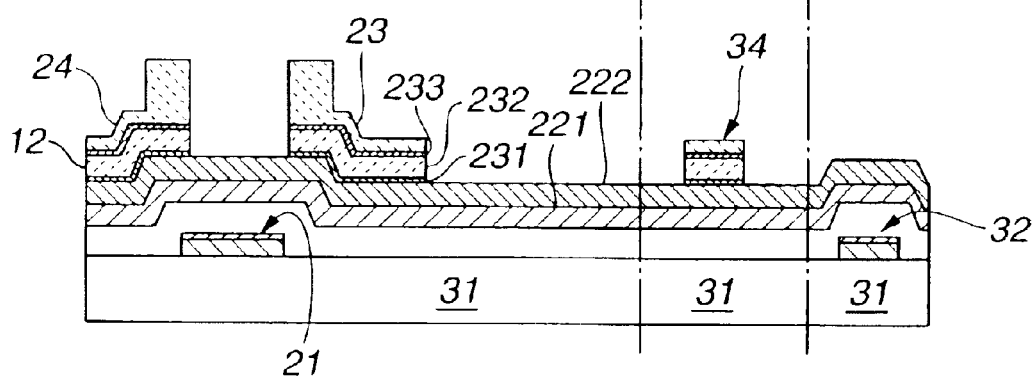

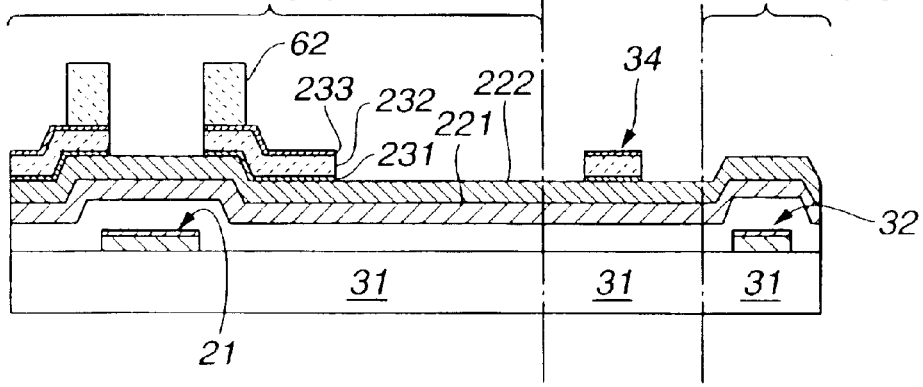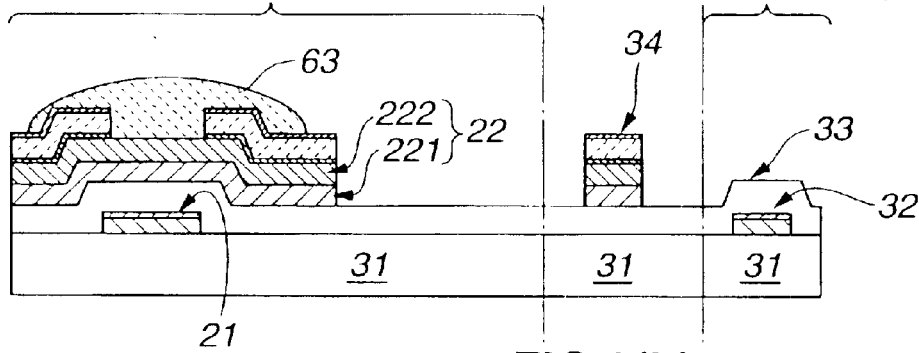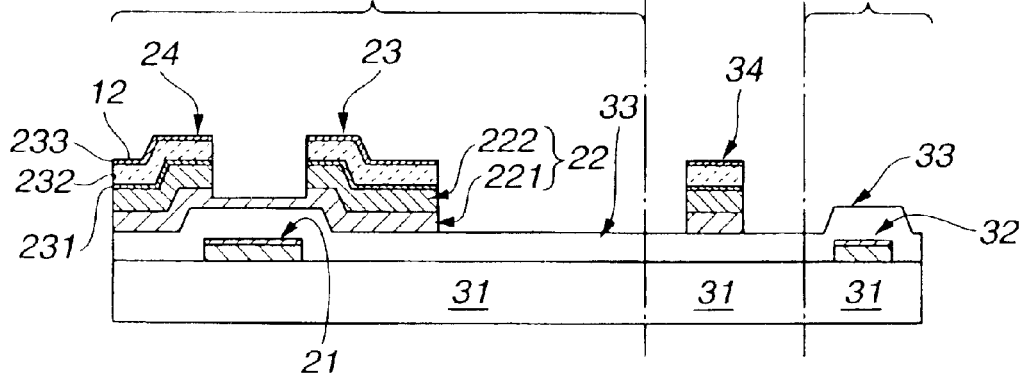

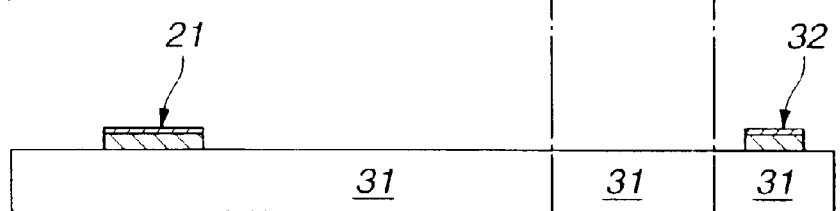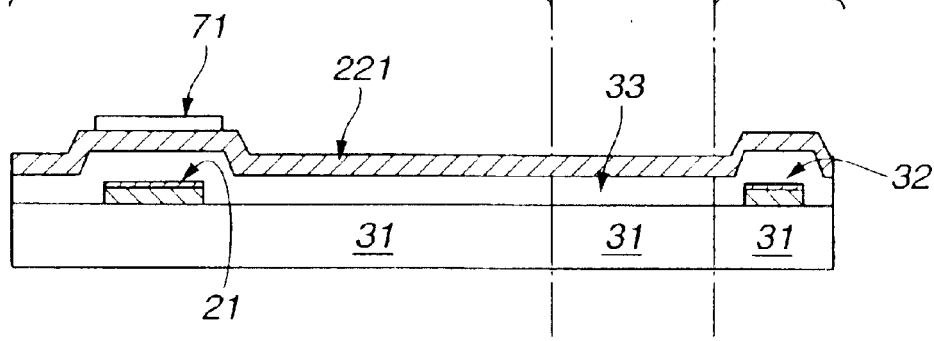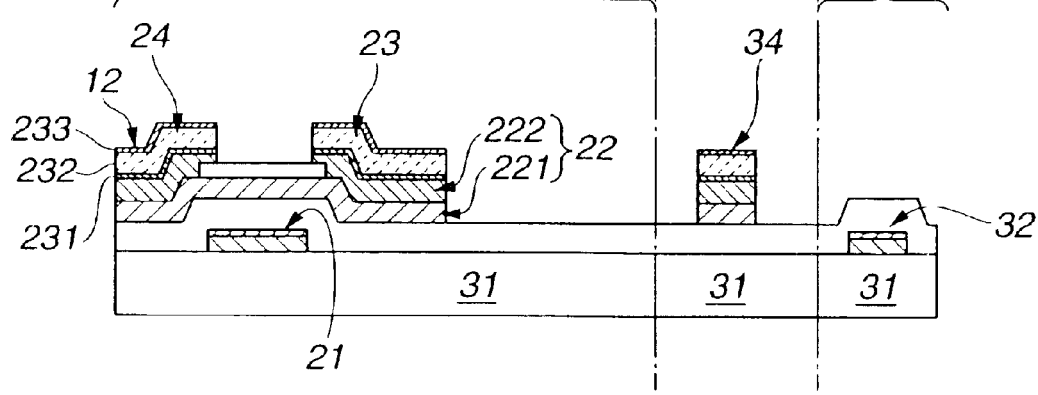

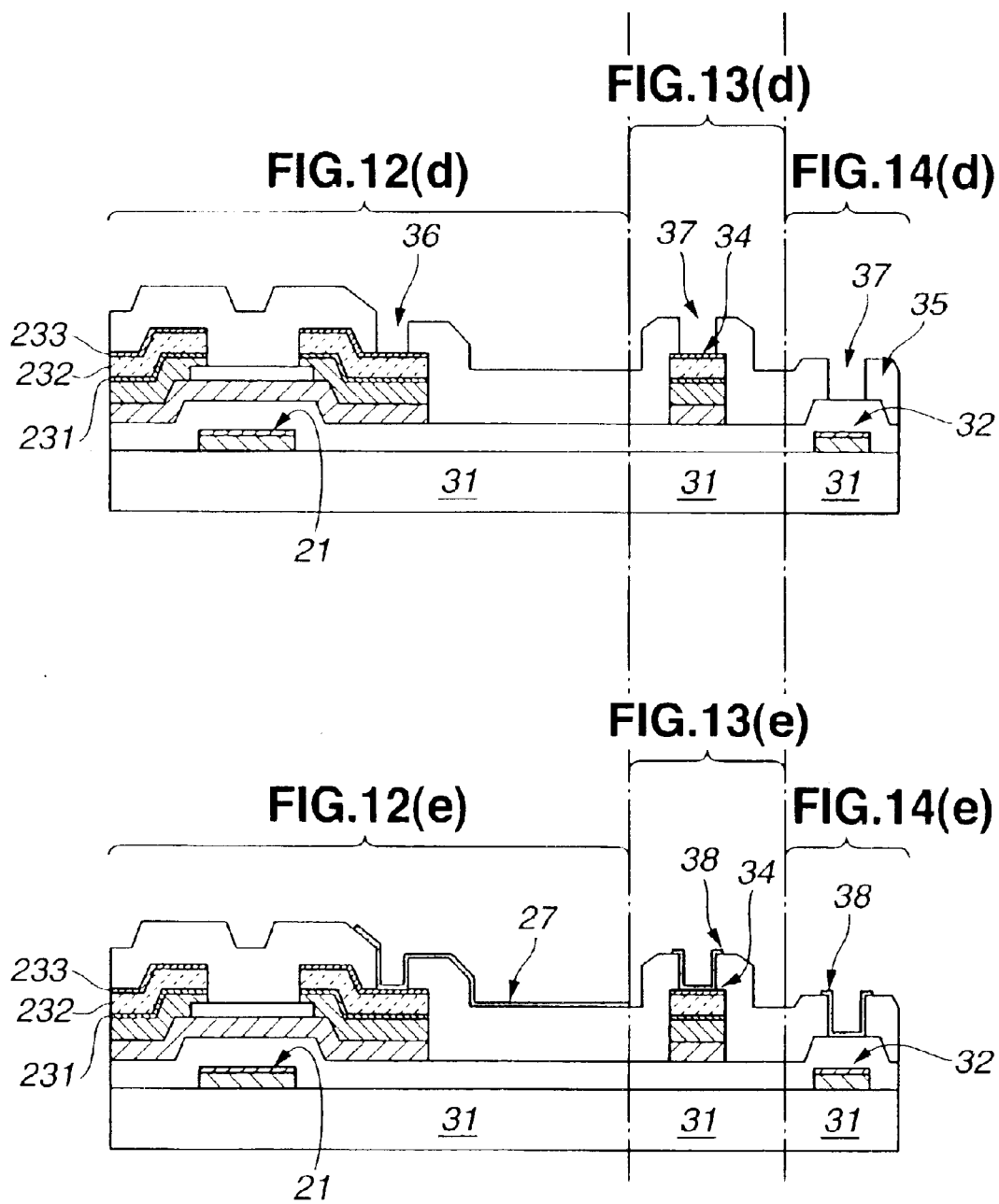

FIG.23

| CONCENTRATION OF Nd | | 0.01wt% | 0.1wt% | 0.5wt% | 1.0wt% | 2.0wt% |
|---|---|---|---|---|---|---|
| HILLOCK | Cr, Ti, Ta, Nb | ○ | ○ | ○ | ○ | ○ |
| | Mo, W, TiN | × | × | ○ | ○ | ○ |
| SPECIFIC RESISTIVITY (μΩcm) | | 3.4 | 3.6 | 3.8 | 4.2 | 4.5 |
| RESIDUE DUE TO DRY ETCH | | ○ | ○ | △ | △ | × |

FIG.24

| ($H_3PO_4$) : ($CH_3$-COOH) = 72:8(wt%) | | | | |
|---|---|---|---|---|
| CONCENTRATION OF $HNO_3$ | 3.9wt% | 4.4wt% | 4.9wt% | 5.4wt% |
| POST ETCHING SHAPE | × | ○ | ○ | ○ |
| ($H_3PO_4$) : ($CH_3$-COOH) = 74:6(wt%) | | | | |
| CONCENTRATION OF $HNO_3$ | 3.7wt% | 4.2wt% | 4.7wt% | 5.2wt% |
| POST ETCHING SHAPE | × | ○ | ○ | ○ |

FIG.25

| PARTIAL PRESSURE OF $H_2O$ | $6\times10^{-4}$pa | $2\times10^{-3}$pa | $5\times10^{-2}$pa | $7\times10^{-2}$pa |
|---|---|---|---|---|
| CONTACT RESISTIVITY | ○ | ○ | △ | × |
| RESIDUE DUE TO WET ETCH | × | ○ | ○ | ○ |

ACTIVE MATRIX SUBSTRATE FOR LIQUID CRYSTAL DISPLAY UTILIZING INTERCONNECTION LINES FORMED FROM MULTILAYERED FILMS THAT INCLUDE AN ALUMINUM-NEODYMIUM ALLOY LAYER

BACKGROUND OF THE INVENTION

1. Field of the Invention

The present invention relates to an active matrix substrate for a liquid crystal display and a method of fabricating an active matrix substrate.

2. Description of the Related Art

Active matrix substrates are widely used in liquid crystal displays and include interconnections. The interconnections include assemblies of scanning and signal lines. In order to create the interconnections, the fabrication of such active matrix substrates requires deposition of a mask each time upon application of photolithography and etching. Deposition of a mask requires time and cost. A need remains to minimize the number of steps of the mask deposition in a direction toward a cost and time reduction in fabricating an active matrix substrate. Various fabrication methods have been proposed, which use four or five masks. Examples of such fabrication methods using five masks are found in JP-A 9-171197 and JP-A 9-197433. An example using four masks is found in JP-A 2000-164886.

For reliable interconnections within a limited area, extensive efforts have been made on development of the material of scanning and signal lines. One example of such material is a pure aluminum (Al) because a thin film of pure aluminum is easy to form and it has a sufficiently low specific resistivity, which property scanning and signal lines should possess. Heat treatment, such as baking or annealing, after forming the scanning and signal lines out of the material is unavoidable. However, the pure aluminum has poor capacity to withstand heat, minute protrusions, called hillocks, are formed on the surface during such heat treatment. Although the mechanism of the formation of hillocks has not been clarified satisfactorily, stress migration, thermal migration, etc., play important roles. Such hillocks cause several problems, such as, short circuit among scanning and signal lines, and penetration of etchant through holes made in a dielectric layer and a protective layer due to the growth of hillocks.

To avoid the occurrence of hillocks, various aluminum alloys have been studied and proposed, which contains a small mass percent (wt %) high melting point metal or rare earth metal. Aluminum-neodymium (Al—Nd) alloy is one example.

The use of Al—Nd alloy as interconnections is known from JP-A 2000-275679, JP-A 2000-47240 and JP-A 2000-314897.

JP-A 2000-275679 shows a double-layered film including an under-layer of Al—Nd alloy and an over-layer of high melting point. It teaches wet etching the double-layered film to form gate electrodes of an active matrix substrate.

JP-A 2000-47240 shows a double-layered film including an under-layer of Al—Nd alloy that contains 1 wt % to 4.5 wt % Nd and an over-layer of high melting point metal. It teaches wet etching the double-layered film to form scanning lines or signal lines. The signal lines have a tapered cross sectional profile, the taper angle of which ranges from 40° to 55°. It also teaches forming such lines out of a triple-layered film., The triple-layered film includes an under-layer of high melting point metal, a middle-layer of Al—Nd alloy and an over-layer of high melting point metal. There is no specific description on the etching of such triple-layered film.

JP-A 2000-314897 shows scanning and signal lines, each coated with a layer of alumina. A double-layered film or a triple-layered film is wet etched to form such lines. The double-layered film includes an under-layer of high melting point metal and an over-layer of Al alloy. The triple-layered film includes an under-layer of high melting point metal, a middle-layer of Al alloy and an over-layer of high melting point metal. The high melting point metal is selected from a group consisting of pure Cr, Cr alloy, pure Mo and Mo alloy. The Al alloy contains 0.1 atomic % to 1.0 atomic % of at least one element selected from a group consisting of Ti, Ta, Nd, Y, La, Sm and Si.

SUMMARY OF THE INVENTION

An object of the present invention is to provide an active matrix substrate having interconnections free from hillocks.

Another object of the present invention is to provide a method of fabricating an active matrix substrate, which results in forming interconnections free from hillocks.

According to one exemplary implementation of the invention, there is provided an active matrix substrate, comprising:

a substrate;

a matrix array of thin film transistors (TFTs) disposed within a display area on said substrate;

a double-layered film including an under-layer of aluminum-neodymium (Al—Nd) alloy and an over-layer of high melting point metal, said double-layered film forming first interconnection lines for connection to said TFTs; and a triple-layered film including an under-layer of said high melting point metal, a middle-layer of said Al—Nd alloy and an over-layer of said high melting point metal, said triple-layered film forming second interconnection lines for connection to said TFTs.

According to another exemplary implementation of the invention, there is provided a method of fabricating a active matrix substrate including a substrate, a matrix array of thin film transistors (TFTs) disposed within a display area on the substrate, scanning lines for connection to the TFTs, and signal lines for connection to the TFTs, said method comprising:

forming a double-layered film including an under-layer of aluminum-neodymium (Al—Nd) alloy and an over-layer of high melting point metal; and removing portions of said double-layered film to form the scanning lines.

According to other exemplary implementation of the present invention, there is provided a method of fabricating a active matrix substrate including a substrate, a matrix array of thin film transistors (TFTs) disposed within a display area on the substrate, scanning lines for connection to the TFTs, and signal lines for connection to the TFTs, said method comprising:

forming a triple-layered film including an under-layer of high melting point metal, a middle-layer of Al—Nd alloy and an over-layer of said high melting point metal; and removing portions of said triple-layered film to form the signal lines.

BRIEF DESCRIPTION OF THE DRAWINGS

The foregoing and other objects, features and advantages of the invention will be apparent from the following more particular description of exemplary embodiments of the invention as illustrated in the accompanying drawings. The drawings are not necessarily scale, emphasis instead being placed upon illustrating the principles of the invention.

FIGS. 3(a), 3(b), 3(c), 3(d) and 3(e) are cross sectional views taken through the line 3—3 in FIG. 2, showing the variation of state over five representative fabrication steps.

FIGS. 4(a), 4(b), 4(c), 4(d) and 4(e) are cross sectional views taken through the line 4—4 in FIG. 2, showing the variation of state over the five representative fabrication steps.

FIGS. 5(a), 5(b), 5(c), 5(d) and 5(e) are cross sectional views taken through the line 5—5 in FIG. 2, showing the variation of state over the five representative fabrication steps.

FIGS. 8(a), 8(b), 8(c) and 8(d) are cross sectional views taken through the line 8—8 in FIG. 7, showing the variation of state over the four representative fabrication steps.

FIGS. 9(a), 9(b), 9(c) and 9(d) are cross sectional views taken through the line 9—9 in FIG. 7, showing the variation of state over the four representative fabrication steps.

FIGS. 10(a), 10(b), 10(c) and 10(d) are cross sectional views taken through the line 10—10 in FIG. 7, showing the variation of state over the four representative fabrication steps.

FIGS. 8(b)-1, 8(b)-2, 8(b)-3, 8(b)-4 and 8(b)-5 are cross sectional views taken through the line 8—8 in FIG. 7, showing the variation of state over the five subsequent fabrication sub-steps to the fabrication process illustrated in FIG. 8(a) to accomplish the state as illustrated in FIG. 8(b).

FIGS. 9(b)-1, 9(b)-2, 9(b)-3, 9(b)-4 and 9(b)-5 are cross sectional views taken through the line 9—9 in FIG. 7, showing the variation of state over the five subsequent fabrication sub-steps to the fabrication process illustrated in FIG. 9(a) to accomplish the state as illustrated in FIG. 9(b).

FIGS. 10(b)-1, 10(b)-2, 10(b)-3, 10(b)-4 and 10(b)-5 are cross sectional views taken through the line 10—10 in FIG. 7, showing the variation of state over the five subsequent fabrication sub-steps to the fabrication process illustrated in FIG. 10(a) to accomplish the state as illustrated in FIG. 10(b).

FIGS. 12(a), 12(b), 12(c), 12(d) and 12(e) are cross sectional views taken through the line 12—12 in FIG. 11, showing the variation of state over five representative fabrication steps.

FIGS. 13(a), 13(b), 13(c), 13(d) and 13(e) are cross sectional views taken through the line 13—13 in FIG. 11, showing the variation of state over the five representative fabrication steps.

FIGS. 14(a), 14(b), 14(c), 14(d) and 14(e) are cross sectional views taken through the line 14—14 in FIG. 11, showing the variation of state over the five representative fabrication steps.

FIG. 23 is a table presenting result of evaluating each of samples in terms of levels of hillock, specific resistivity and dry etching residue.

FIG. 24 is a table presenting result of evaluating each of samples in terms of levels of post etching shape.

FIG. 25 is a table presenting result of evaluating each of samples in terms of levels of contact resistivity and wet etching residue.

DESCRIPTION OF THE EXEMPLARY EMBODIMENTS

Figure 1:
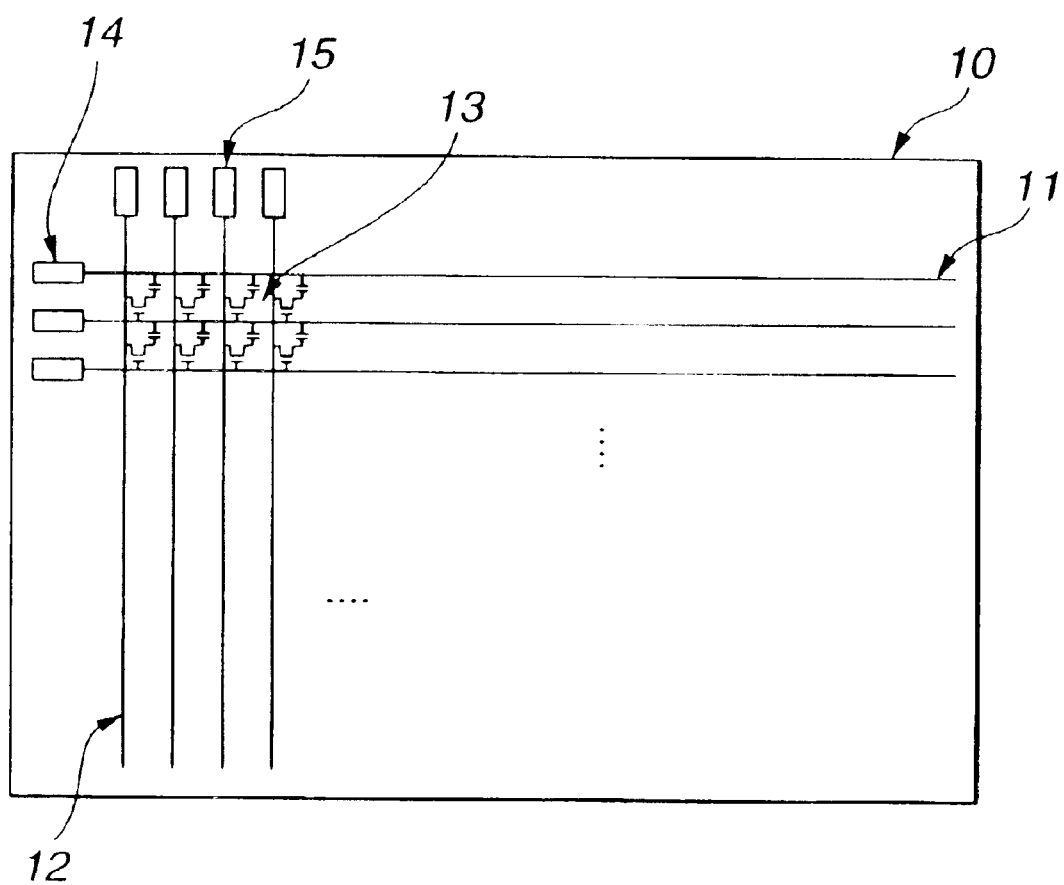
FIG. 1 is a schematic view of an active matrix substrate for a liquid crystal display.

Referring to the accompanying drawings, the same reference numerals are used to designate same or similar parts or portions throughout each view of Figures for the sake of brevity of description.

Figure 6:
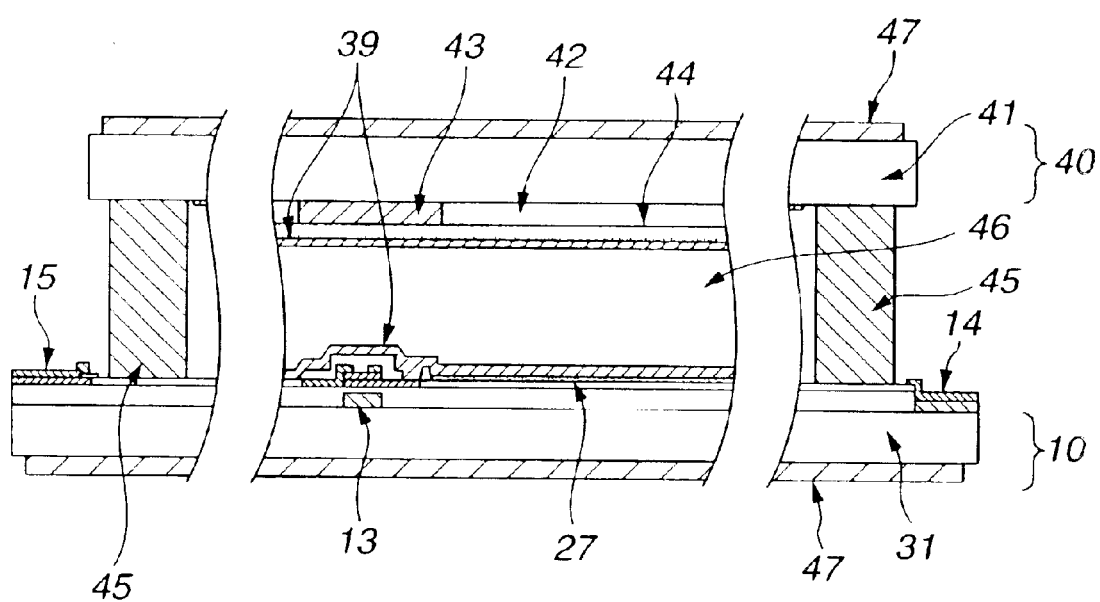
FIG. 6 is a sectional view of portions of a liquid crystal display incorporating the active matrix substrate.
Figure 7:
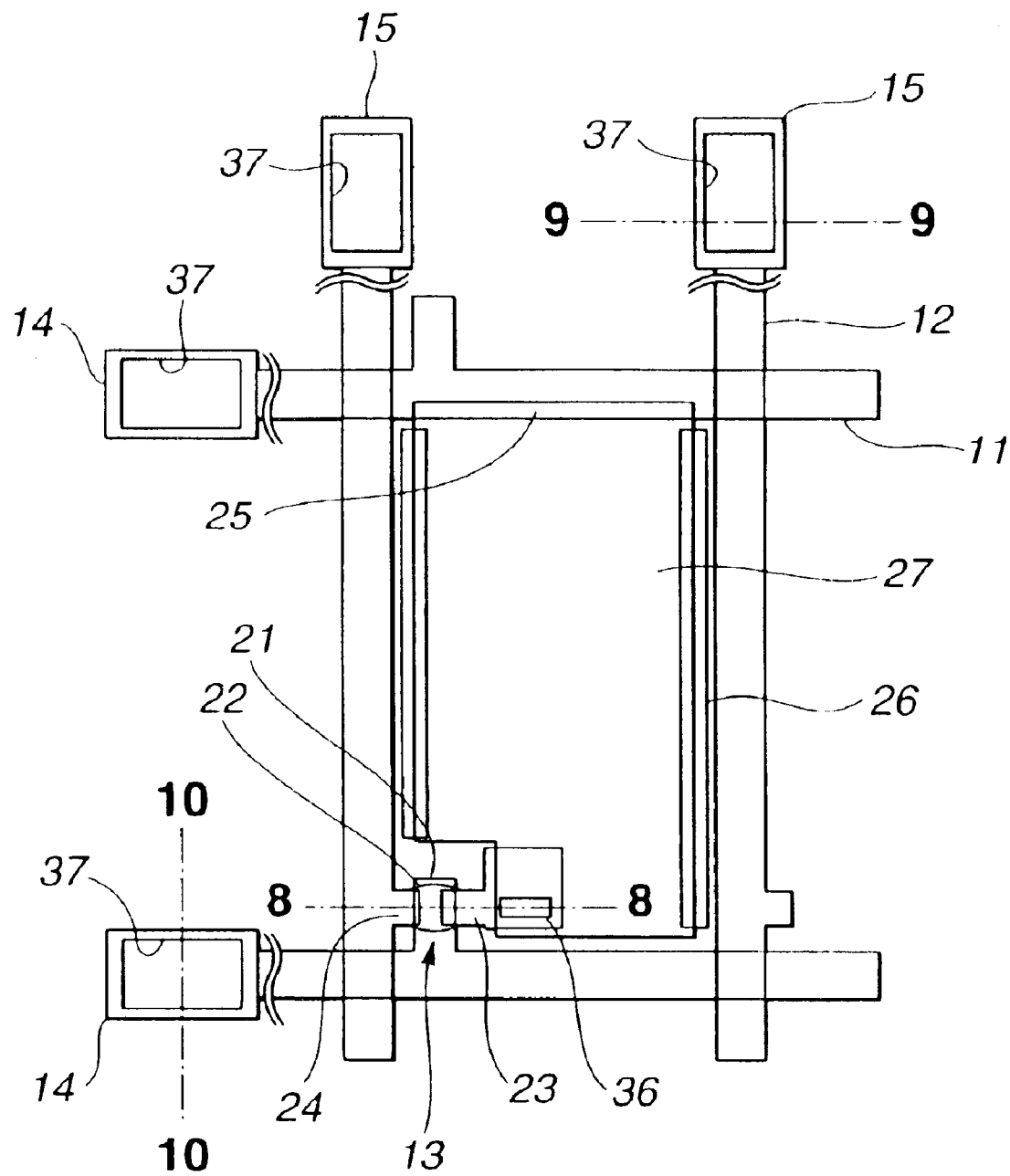
FIG. 7 is a schematic view similar to FIG. 2, showing one pixel region of another active matrix substrate.
Figure 11:
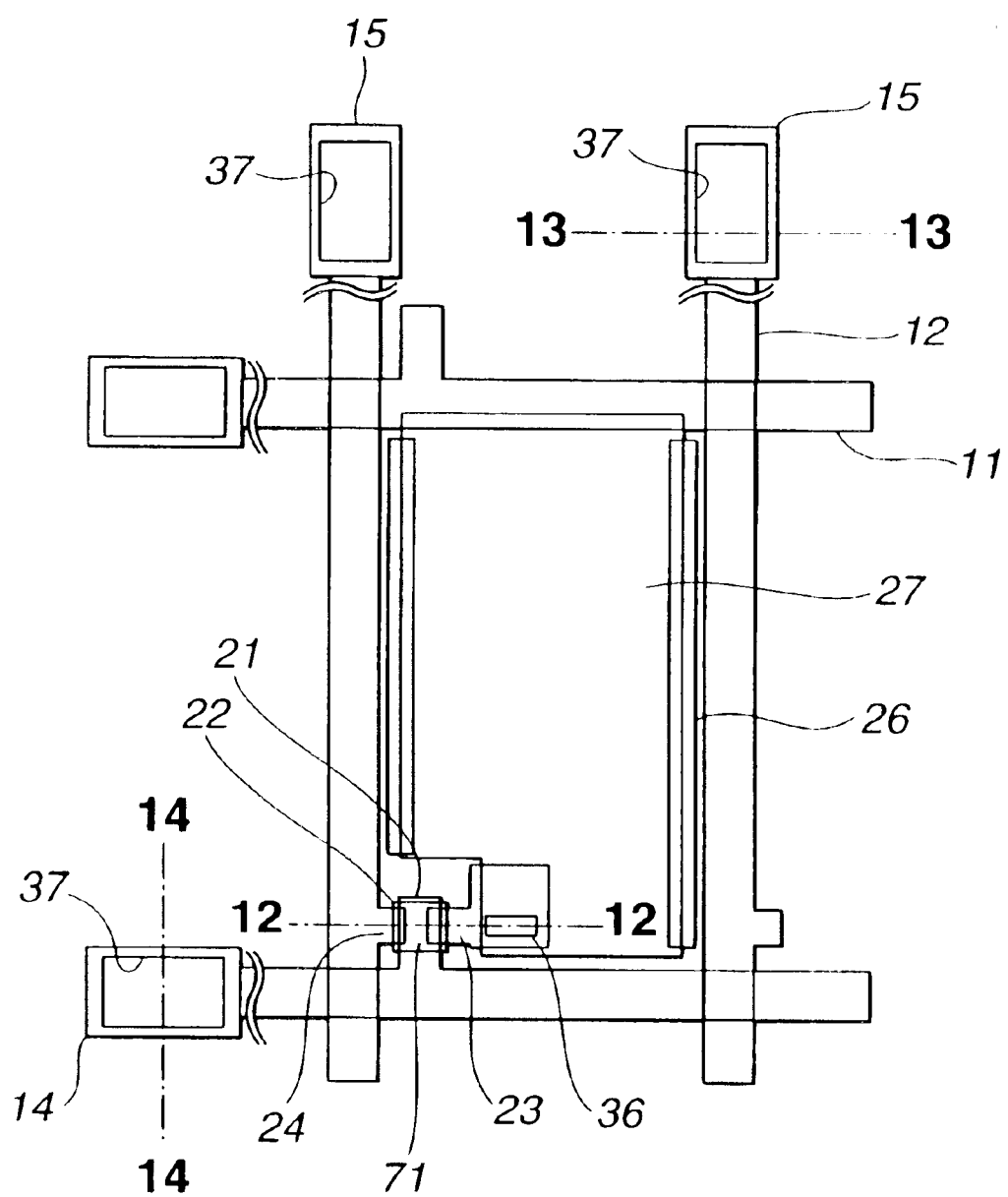
FIG. 11 is a schematic view similar to FIG. 7, showing one pixel region of other active matrix substrate.

With reference to FIGS. 1 to 6, a first exemplary embodiment of an active matrix substrate 10 is described. FIG. 6 shows a liquid crystal display (LCD) incorporating the active matrix substrate 10. Referring also to FIG. 6, the LCD includes, in addition to the active matrix substrate 10, a color filter substrate 40, and liquid crystal 46 interposed between the two substrates 10 and 40. To prevent the liquid crystal 46 from leaking out of a display area of the LCD, a seal 45 is provided between the substrates 10 and 40. The active matrix substrate 10 includes a transparent substrate 31, a matrix array of thin film transistors (TFTs) 13 and pixel electrodes 27, which are disposed in the display area on the transparent substrate 31. The opposing color filter substrate 40 includes a transparent dielectric substrate 41, color filters 42, a black matrix 43 and common electrode 44. The LCD includes orientation films 39 on the substrates 10 and 40, respectively. The LCD also includes polarizing plates 47 on the substrates 10 and 40, respectively. The LCD further includes scanning line terminals 14 and signal line terminals 15.

In the first exemplary embodiment, the active matrix substrate 10 includes a matrix array of inverted staggered channel etch type TFTs as the matrix array of TFTs 13. Fabrication of the active matrix substrate 10 requires steps of forming a film and removing unnecessary portions of the film, by etching, to form a desired profile. Such etching steps require five (5) masks.

Figure 2:
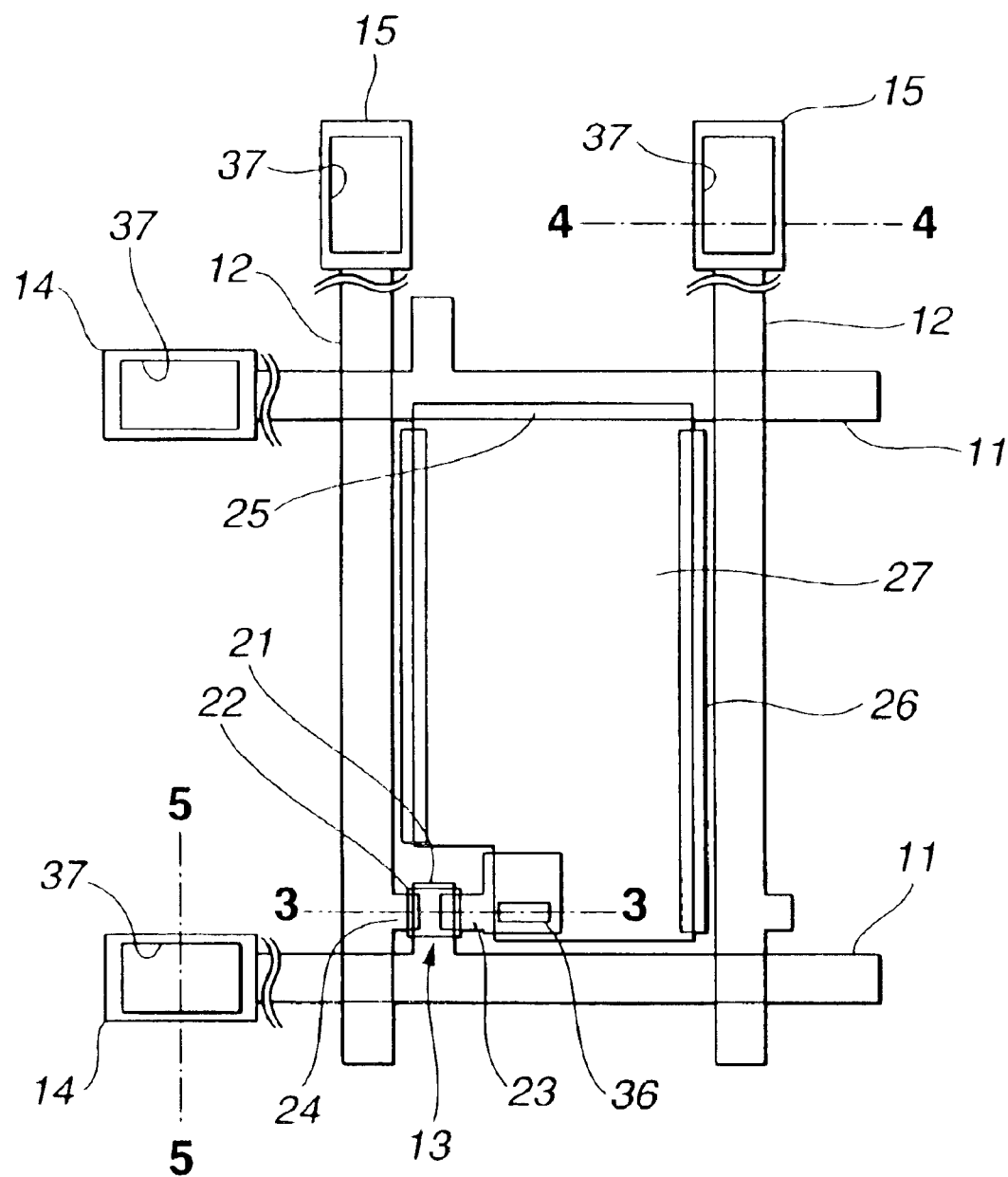
FIG. 2 is a schematic view of one pixel region of the active matrix substrate.

Referring now to FIGS. 1 and 2, the active matrix substrate 10 is further described. Viewing in FIG. 1, the active matrix substrate 10 includes, within the display area on the transparent substrate 31 (see FIG. 6), an assembly of parallel horizontal scanning (or gate) lines 11 and an assembly of parallel vertical signal (or drain) lines 12. The scanning lines 11 include portions forming gate electrodes, only one being shown at 21 in FIG. 2, of the TFTs 13. The signal lines 12 include portion forming drain electrodes, only one being shown at 24 in FIG. 2, of the TFTs 13. Each of the TFTs 13 is positioned near one of a number of crossing points of the scanning and signal lines 11 and 12. At end portions thereof, the scanning lines 11 form the scanning line terminals 14, respectively. At end portions thereof, the signal lines 12 are form the signal line terminals 15, respectively. Each of the pixel electrodes 27 is formed within one of a number of rectangular areas, which are defined by the scanning and signal lines 11 and 12.

FIG. 2 shows one pixel region of the active matrix substrate 10 illustrating a scanning line 11 connected to a gate terminal of a TFT 13, one pixel electrode 27 and the preceding scanning line 11. The pixel electrode 27 includes a portion overlapping a portion of the preceding scanning line 11. These overlapping portions form a storage capacitor 25 that stores electric charges. The active matrix substrate 10 includes a light shielding layer 26 and an underlying metallic film 32 of the scanning line terminals 14. Each scanning line terminal 14 is exposed via a contact hole 37; see FIGS. 5(a) to 5(e). Referring to FIG. 3(e), the active matrix substrate 10 includes a gate dielectric film 33 over the gate electrode 21, a laminated semiconductor layer 22 opposed to the gate electrode 21, a source electrode 23 and a drain electrode 24. The source and drain electrodes 23 and 24 are separated from each other and formed on the semiconductor layer 22. As best seen in FIGS. 3(d), 4(d) and 5(d), a passivation film 35 is grown on the surfaces of the source electrode 23, drain electrode 24, signal line 12 connected to the drain electrode 24, and the underlying metallic film 34 of each of signal line terminals 15. To establish access to the source electrode 23, the passivation film 35 is formed with a pixel contact hole 36. To expose the signal and scanning line terminals 14 and 15, the passivation film 35 is formed also with contact holes 37. As seen from FIGS. 2, 3(e), 4(e) and 5(e), via the pixel contact hole 36, the pixel electrode 27 is connected to the source electrode 23. Via the contact holes 37, connecting electrodes 38 are connected to the underlying metallic films 32 and 34, respectively.

With continuing reference to FIGS. 1, 2, 3(e), 4(e) and 5(e), according to the first exemplary embodiment, the active matrix substrate 10 comprises a matrix array of TFTs 13 disposed in the display area on the transparent substrate 31, and a matrix array of pixel electrodes 27 connected to the TFTs 13. As mentioned before, the pixel electrodes 27 are connected to the source electrodes 23 of the TFTs 13. As best seen in FIGS. 3(a) and 5(a), the active matrix substrate 10 also includes a double-layered film including an under-layer 211 of aluminum-neodymium (Al—Nd) alloy and an over-layer 212 of high melting point metal. The double-layered film is patterned to form the gate electrodes 21 of the TFTs 13 and the assembly of scanning lines 11 connected to the gate electrodes 21. As best seen in FIGS. 3(c) and 4(c), the active matrix substrate 10 further includes a triple-layered film including an under-layer 231 of the high melting point metal, a middle-layer 232 of the Al—Nd alloy and an over-layer 233 of the high melting point metal. The triple-layered film is patterned to form the drain electrodes 24 of the TFTs 13 and the assembly of signal lines 12 connected to the drain electrodes 24.

In the first exemplary embodiment, the active matrix substrate 10 uses, as the high melting point metal, a high melting point metal selected from a group consisting of chromium (Cr), titanium (Ti), tantalum (Ta), niobium (Nb), chromium alloy, titanium alloy, tantalum alloy, niobium alloy, molybdenum (Mo), tungsten (W), titanium nitride (TiN), molybdenum alloy, tungsten alloy, and titanium nitride alloy.

The concentration of neodymium (Nd) within the Al—Nd alloy, if it falls in an appropriate range, provides enhanced wet etching without creation of hillocks. This appropriate range of Nd, however, is dependent on the material selected as the high melting point metal used in the double and triple-layered films.

In the case where the active matrix substrate 10 uses, as the high melting point metal, one selected from a group consisting of chromium (Cr), titanium (Ti), tantalum (Ta), niobium (Nb), chromium alloy, titanium alloy, tantalum alloy, and niobium alloy, the Al—Nd alloy contains 0.01 wt % to 1.00 wt % neodymium (Nd).

In the case where the active matrix substrate 10 uses, as the high melting point metal, one selected from a group consisting of molybdenum (Mo), tungsten (W), titanium nitride (TiN), molybdenum alloy, tungsten alloy, and titanium nitride alloy, the Al—Nd alloy contains 0.5 wt % to 1.0 wt % neodymium (Nd).

The active matrix substrate 10 according to the first exemplary embodiment has an advantage that it is easy to pattern and free from hillocks;

With reference now to FIGS. 1, 7, 8(a)–8(d), 9(a)–9(d), 10(a)–10(d), 8(b)-1 to 8(b)-5, 9(b)-1 to 9(b)-5, and 10(b)-1 to 10(b)-5, a second exemplary embodiment of an active matrix substrate 10 is described.

In the second exemplary embodiment, similarly to the first exemplary embodiment, the active matrix substrate 10 includes a matrix array of inverted staggered channel etch type TFTs as a matrix array of TFTs 13. Fabrication of the active matrix substrate 10 requires steps of depositing to form a film and etching to form a desired profile out of such film. As different from the first exemplary embodiment, such etching steps require four (4) sheets of masks or masking layers.

The active matrix substrate 10 according to the second exemplary embodiment is substantially the same as the active matrix substrate 10 according to the first exemplary embodiment except the outlines of separated source and drain electrodes 23 and 24 that are formed on the underlying semiconductor layer 22. As best seen in FIG. 3(e), in the first exemplary embodiment, the source and drain electrodes 23 and 24 extend beyond the sidewalls of the underlying semiconductor layer 22 so that the sidewalls of the source and drain electrodes 23 and 24 do not vertically align with the sidewalls of the underlying semiconductor layer 22. FIG. 8(d) is comparable to FIG. 3(e). As best seen in FIG. 8(d), in the second exemplary embodiment, the sidewalls of the source and drain electrodes 23 and 24 vertically align with the sidewalls of the underlying semiconductor layer 22.

With reference now to FIGS. 1, 11, 12(a)–12(e), 13(a)–13(e), and 14(a)–14(e), a third exemplary embodiment of an active matrix substrate 10 is described.

In the third exemplary embodiment, as different from the second exemplary embodiment, the active matrix substrate 10 includes a matrix array of inverted staggered TFTs of the channel protective type as a matrix array of TFTs 13. Fabrication of the active matrix substrate 10 requires steps of depositing to form a film and etching to form a desired profile out of such film. As different from the second exemplary embodiment, such etching steps require five (5) sheets of masks or masking layers.

The active matrix substrate 10 according to the third exemplary embodiment is substantially the same as the active matrix substrate 10 according to the second exemplary embodiment except the provision of a channel protective film 71 as shown in FIG. 12(b).

Referring to FIGS. 3(a)–3(e), 4(a)–4(e), and 5(a)–5(e), steps for fabricating the first exemplary embodiment of active matrix substrate 10 (see FIG. 2) are described. FIGS. 3(a), 4(a) and 5(a) illustrate one process of forming gate electrodes and scanning lines. FIGS. 3(b), 4(b) and 5(b) illustrate another process of forming gate dielectric film and semiconductor layer. FIGS. 3(c), 4(c) and 5(c) illustrate still another process of forming source electrodes, drain electrodes and signal lines. FIGS. 3(d), 4(d) and 5(d) illustrate further process of forming passivation film and contact holes. FIGS. 3(e), 4(e) and 5(e) illustrate other process of forming conductors. As is readily seen from FIGS. 3(a), 4(a) and 5(a), a double-layered film forms the gate electrodes and the scanning lines. The double-layered film includes an under-layer of Al—Nd alloy and an over-layer of high melting point metal. As is readily seen from FIGS. 3(c), 4(c) and 5(c), a triple-layered film includes an under-layer of high melting point metal, a middle-layer of Al—Nd alloy and an over-layer of high melting point metal.

In the process of FIGS. 3(a), 4(a) and 5(a), a sheet of no-alkali glass having 0.7 mm thick is used as the transparent substrate 31. In the first exemplary embodiment, a double-layered film is formed on the transparent substrate 31. The double-layered film includes an under-layer 211 of Al—Nd alloy and an over-layer 212 of high melting point metal. Sputtering is used to form the under-layer 211 of Al—Nd alloy on the surface of the transparent substrate 31. Subsequently, sputtering is used to form the over-layer 212 of high melting point metal on the under-layer 211. The under-layer 211 of Al—Nd has about 200 nm thick. The over-layer 212 of high melting point metal has about 100 nm thick. Removing, including photolithography and etching, portions of the double-layered film (211, 212) to form gate electrode 21, scanning lines, storage capacitor electrodes, light shielding layer, and underlying metallic film 32 of the scanning lines.

In the case where the over-layer 212 of the double-layered film is formed of a high melting point metal selected from a group consisting of chromium (Cr), titanium (Ti), tantalum (Ta), niobium (Nb), chromium alloy, titanium alloy, tantalum alloy, and niobium alloy, the concentration of neodymium (Nd) of the under-layer 211 ranges from 0.01 wt % to 1.00 wt %.

In the case where the over-layer 212 of the double-layered film is formed of a high melting point metal selected from a group consisting of molybdenum (Mo), tungsten (W), titanium nitride (TiN), molybdenum alloy, tungsten alloy, and titanium nitride alloy, the concentration of neodymium (Nd) of the under-layer 211 ranges from 0.5 wt % to 1.0 wt %.

The detailed description on the manner of etching the double-layered film to form scanning line will be made later.

In the process of FIGS. 3(b), 4(b) and 5(b), in the first exemplary embodiment, a gate dielectric layer 33 and a double-layered semiconductor layer 22 are formed. The dielectric layer 33 is formed of a silicon nitride film having about 400 nm thick. Plasma CVD is used to deposit the silicon nitride film. Plasma CVD is used to deposit an amorphous silicon (a-Si) under-layer 221 on the dielectric layer 33. Plasma CVD is used to deposit a phosphorus-doped (P-doped) n-type amorphous silicon ($n^+$a-Si) over-layer 222. The a-Si layer 221 has about 200 nm thick. The $n^+$a-Si layer 222 has about 30 nm thick. Photolithography and etching on the doubled-layered structure forms the semiconductor layer 22.

In the process of FIGS. 3(c), 4(c) and 5(c), according to the first exemplary embodiment, a triple-layered film is formed over the semiconductor layer 22 and the dielectric layer 33. The triple-layered film includes an under-layer 231 of high melting point metal, a middle-layer 232 of Al—Nd alloy and an over-layer 233 of high melting point metal. Sputtering is used to form the under-layer 231 of high melting point metal over surfaces of the semiconductor layer 22 and the dielectric layer 33. Sputtering is used to form the middle-layer 232 of Al—Nd alloy on the surface of the under-layer 231. Subsequently, sputtering is used to form the over-layer 233 of high melting point metal on the middle-layer 232. The under-layer 231 of high melting point metal has about 50 nm thick. The middle-layer 232 of Al—Nd has about 200 nm thick. The over-layer 233 of high melting point metal has about 100 nm thick. Removing, including photolithography and etching, portions of the triple-layered film (231, 232, 233) results in forming source electrode 23, drain electrode 24, signal lines 12, and underlying metallic film 34 of the signal lines.

In the case where the under and over layers 231 and 233 of the triple-layered structure are formed of a high melting point metal selected from a group consisting of chromium (Cr), titanium (Ti), tantalum (Ta), niobium (Nb), chromium alloy, titanium alloy, tantalum alloy, and niobium alloy, the concentration of neodymium (Nd) of the middle-layer 232 ranges from 0.01 wt % to 1.00 wt %.

In the case where the under and over layers 231 and 233 of the triple-layered structure are formed of a high melting point metal selected from a group consisting of molybdenum (Mo), tungsten (W), titanium nitride (TiN), molybdenum alloy, tungsten alloy, and titanium nitride alloy, the concentration of neodymium (Nd) of the middle-layer 232 ranges from 0.5 wt % to 1.0 wt %.

The detailed description on the manner of etching the triple-layered film to form signal line will be made later.

To separate the source and drain electrodes 23 and 24 from each other, etching is used to remove the portion of $n_+$a-Si layer 222 disposed between them. The etching may utilize, as a masking layer, a photoresist, which is used for forming the source and drain electrodes 23 and 24. If desired, after having removed the photoresist, the source and drain electrodes may be used as a masking layer. The use of hydrochloric acid (HCl) must be prohibited as an element of etchant gas. The etchant gas may be one selected from a family of fluoride-based gas. The etchant gas may be a mixture of one selected from the family of fluoride-based gas and another selected from a family of chloride-based gas. In the exemplary embodiment, the family of chloride-based gas excludes HCl. One example of such etchant is a mixture gas of sulfur hexafluoride ($SF_6$), chloride ($Cl_2$) and hydrogen ($H_2$). Using this mixture gas as etchant, the etching may be performed (one step etching). Another and other examples are a first mixture gas of methane trifluoride ($CHF_3$), oxygen ($O_2$) and helium (He), and a second mixture gas of $SF_6$ and He, respectively. Using the first and second mixture gases, the etching may be performed in two steps. The etching may be performed in various modes. One example is plasma etching (PE mode). Another example is reactive ion etching (RIE mode). It is confirmed that the etching, without HCl, effectively prevents corrosion of Al—Nd alloy.

In the process of FIGS. 3(d), 4(d) and 5(d), plasma CVD is used to deposit a film of silicon nitride (SiN) over the entire surface of the underlying structure as the passivation film 35. The passivation film 35 has about 200 nm thick. Using photolithography and etching, pixel contact holes 36 and terminal contact holes 37 are formed through the passivation film 35.

In the process of FIGS. 3(e), 4(e) and 5(e), sputtering is used to deposit a film of indium tin oxide (ITO) or indium zinc oxide (IZO) as a transparent conductive film. The transparent conductive film has about 50 nm thick. Photolithography and etching on the transparent conductive film result in forming pixel electrode 27 and connecting electrodes 38 of the terminals. Oxalic acid ($C_2H_2O_4$) is used in etching the transparent conductive film. Since such weak acid as oxalic acid is used, the underlying Al—Nd is prevented from being damaged during the etching of such transparent conductive film of ITO or IZO. If ITO is to be deposited to form a transparent conductive film, simultaneously with introduction of argon (Ar) and oxygen, water is introduced into a process chamber of sputtering equipment to create, within the chamber, atmosphere-containing water at partial water pressure ranging from $2\times10^{-3}$ pa to $5\times10^{-2}$ pa, and ITO is deposited by DC magnetron sputter to form a film. During this sputtering, the substrate is processed at room temperature so that heating of the substrate is not needed. This makes it possible to use oxalic acid in etching the transparent conductive film. Besides, this suppresses an increase in electrical contact resistance between the transparent conductive film and the underlying metallic film. The discussion on this suppression will be made later.

At about relatively low temperature of 270° C., the damages due to sputtering are removed by annealing to complete the active matrix substrate 10.

Etching steps of a double-layered film and a triple-layered film to form scanning and signal lines will now be described in the case where chromium (Cr) or chromium alloy is used as high melting point metal.

With reference to FIGS. 15(a), 15(b), 15(c) and 15(d), an etching process for removing portions of a double-layered film to form a scanning line 11 is now described.

Figure 15A:
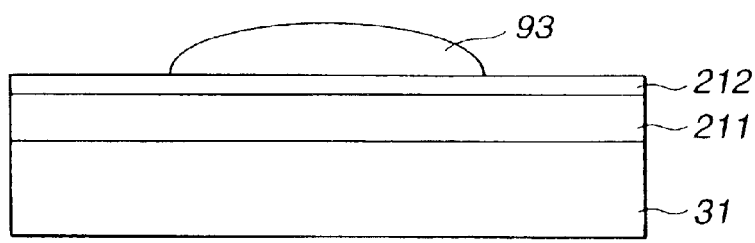
FIGS. 15(a), 15(b), 15(c) and 15(d) are schematic views of removing portions of a double-layered film to form a scanning line if chromium (Cr) or chromium alloy is used as an over-layer of high melting point metal.

Referring to FIG. 15(a), the double-layered film is formed on the transparent substrate 31. The double-layered film includes an under-layer 211 of Al—Nd alloy that contains 0.01 wt % to 1.00 et % Nd and an over-layer 212 of high melting point metal that is chromium (Cr). Photoresist 93 is applied to the surface of the over-layer 212 and formed into a desired pattern as shown in FIG. 15(a) by exposure and development.

Figure 15B:
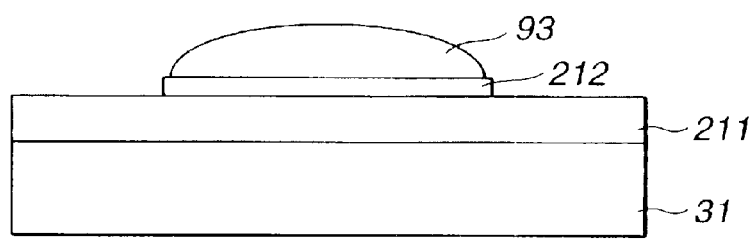

Referring to FIG. 15(b), using the photoresist 93 as mask, wet etching is applied at room temperature to remove unmasked portions of the over-layer 212 of Cr. A mixture of ammonium cerium (IV) nitrate and nitric acid ($HNO_3$) is etchant for the wet etching. The wet etching may be performed in any desired mode, such as shower mode or dip mode.

Figure 15C:
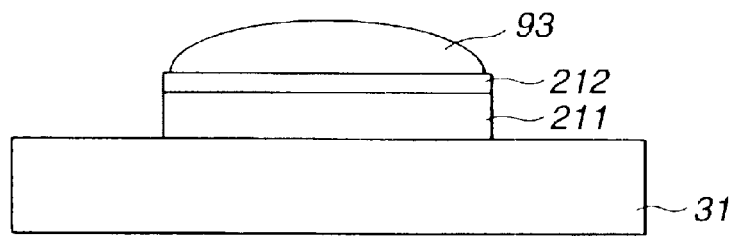

Referring to FIG. 15(c), using the same photoresist as mask, dry etching is applied to remove unmasked portions of the under-layer 211 of Al—Nd. Chlorine ($Cl_2$) and boron trichloride ($BCl_3$) are used as etchant gas. In the exemplary embodiment, reactive ion etching (RIE) is performed at pressure of 1.3 pa. The flow rate of $Cl_2$ is 60 sccm and the flow rate of $BCl_3$ 20 sccm. The distance between electrodes is 150 mm.

Figure 15D:
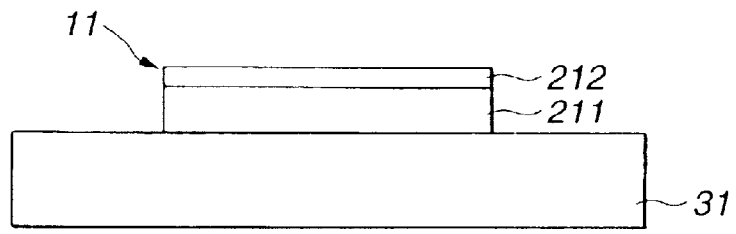

Referring to FIG. 15(d), the photoresist 93 is removed to provide the scanning line 11.

With reference to FIGS. 16(a), 16(b), 16(c), 16(d) and 16(e), an etching process for removing portions of a triple-layered film to form a signal line 12 is now described.

Figure 16A:
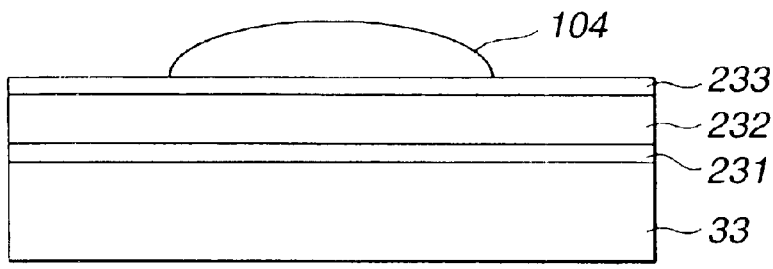
FIGS. 16(a), 16(b), 16(c), 16(d) and 16(e) are schematic views of removing portions of a triple-layered film to form a signal line if chromium (Cr) or chromium alloy is used as an over-layer of and an under-layer of high melting point metal.

Referring to FIG. 16(a), the triple-layered film is formed on the gate dielectric layer 33. The triple-layered film includes an under-layer 231 of high melting point metal that is chromium (Cr), a middle-layer 232 of Al—Nd alloy that contains 0.01 wt % to 1.00 et % Nd and an over-layer 233 of high melting point metal that is chromium (Cr). Photoresist 104 is applied to the surface of the over-layer 233 and formed into a desired pattern as shown in FIG. 16(a) by exposure and development.

Figure 16B:
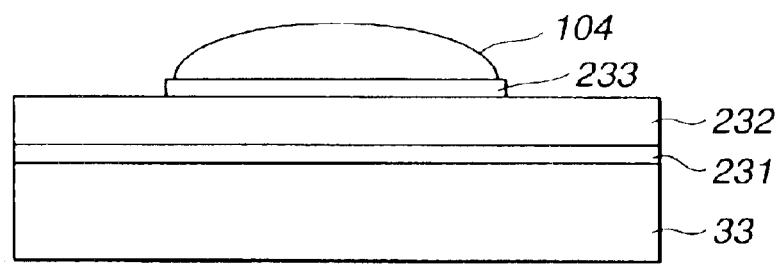

Referring to FIG. 16(b), using the photoresist 104 as mask, wet etching is applied to remove unmasked portions of the over-layer 233. Similarly to the previously described etching process in connection with FIG. 15(b), a mixture of ammonium cerium (IV) nitrate and nitric acid ($HNO_3$) is etchant for this wet etching. The wet etching may be performed in any desired one of modes, including puddle mode and dip mode. The pattern of photoresist 104 has a sidewall tapered upward from the surface of the triple-layered film as shown in FIGS. 16(a) and 16(b) at an angle ranging from 30° to 55°. The discussion on this angle of the sidewall will be made later.

Figure 16C:
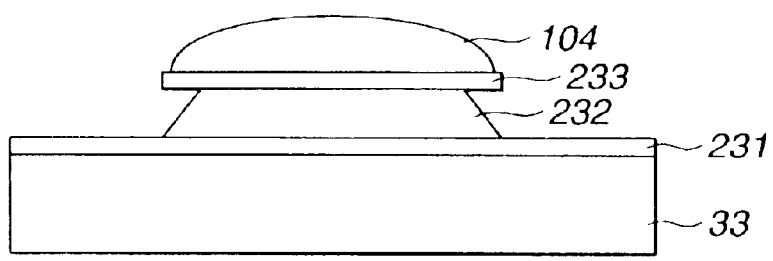

Referring to FIG. 16(c), using the same photoresist 104 as mask, wet etching is applied at temperature ranging from 40° C. to 50° C. to remove unmasked portions of the middle-layer 232 of Al—Nd. A mixture of phosphoric acid ($H_3PO_4$), nitric acid ($HNO_3$) and acetic acid ($CH_3$—COOH) is the etchant used in this wet etching. The wet etching may be performed in any desired mode, such as shower mode or dip mode.

Figure 16D:
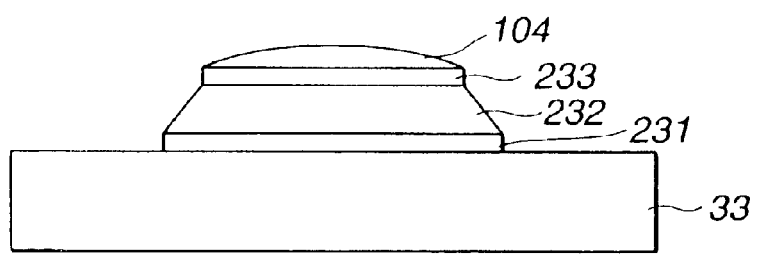

Referring to FIG. 16(d), using, as etching gas, chlorine ($Cl_2$) and oxygen ($O_2$), dry etching is applied to etch the under-layer 231. In the dry etching process, the photoresist 104 loses volume due to ashing by $O_2$ thereby to expose an overhang portion, as shown in FIG. 16(c), of the over-layer 233, allowing removal of the overhang portion by the dry etching. This dry etching may be performed in any desired mode, such as PE mode or RIE mode. Such loss in volume of the photoresist 104 due to ashing is easy to occur by tapering the sidewall of the photoresist 104 at an angle ranging from 30° to 55°.

Figure 16E:
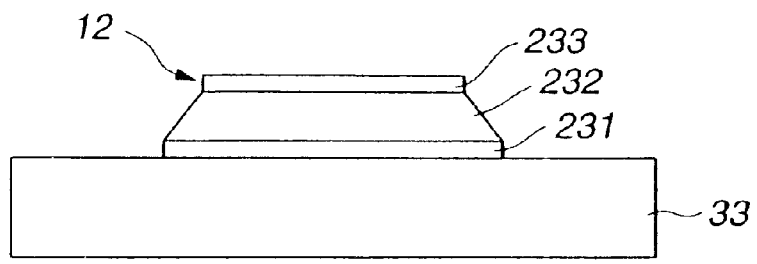

Referring to FIG. 16(e), the photoresist 104 is removed to provide the signal line 12.

Etching steps of a double-layered film and a triple-layered film to form scanning and signal lines will now be described in the case where molybdenum (Mo) or molybdenum alloy is used as high melting point metal.

Figure 17A:
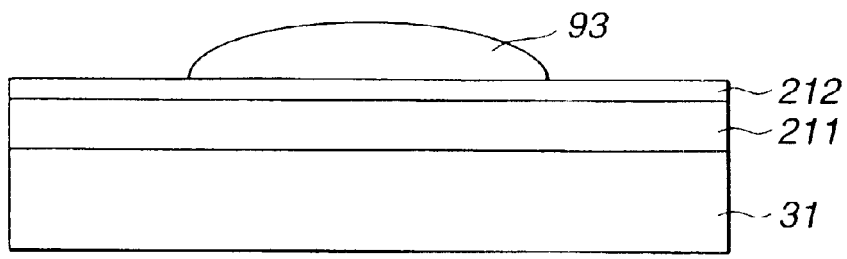
FIGS. 17(a), 17(b) and 17(c) are schematic views of removing portions of a double-layered film to form a scanning line if molybdenum (Mo) or molybdenum alloy is used as an over-layer of high melting point metal.
Figure 17B:
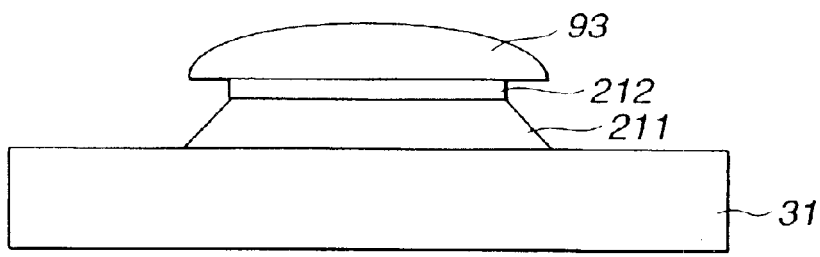
Figure 17C:
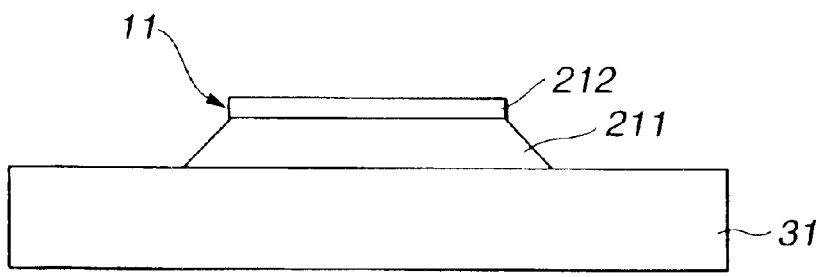

With reference to FIGS. 17(a), 17(b) and 17(c), an etching process for removing portions of a double-layered film to form a scanning line 11 is now described.

Referring to FIG. 17(a), the double-layered film is formed on the transparent substrate 31. The double-layered film includes an under-layer 211 of Al—Nd alloy that contains 0.5 wt % to 1.0 wt % Nd and an over-layer 212 of high melting point metal that is molybdenum (Mo). Photoresist 93 is applied to the surface of the over-layer 212 and formed into a desired pattern as shown in FIG. 17(a) by exposure and development.

Referring to FIG. 17(b), using the photoresist 93 as mask, wet etching is applied at temperature ranging from 40° C. to 50° C. to remove unmasked portions of the over-layer 212 of Mo and under-layer 211 of Al—Nd. A mixture of phosphoric acid ($H_3PO_4$), nitric acid ($HNO_3$) and acetic acid ($CH_3$—COOH) is the etchant used in this wet etching. The composition of the etchant is adjusted such that the etch rate of Mo is greater than the etch rate of Al—Nd. One example of the preferred ratio in mass % of phosphoric acid ($H_3PO_4$), nitric acid ($HNO_3$) and acetic acid ($CH_3$—COOH) is 72:4.4 to 5.4:8. Another example of such ratio is 74:4.2 to 5.2:6. The wet etching may be performed in any desired mode, such as shower mode or dip mode. However, shower mode with or without one of puddle mode and dip mode are preferred.

Referring to FIG. 17(c), the photoresist 93 is removed to provide the scanning line 11.

Figure 18A:
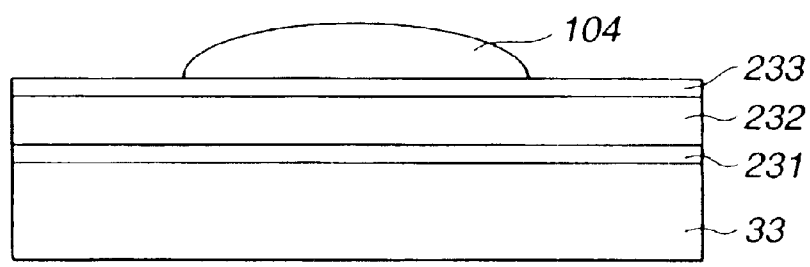
FIGS. 18(a), 18(b) and 18(c) are schematic views of removing portions of a triple-layered film to form a signal line if molybdenum (Mo) or molybdenum alloy is used as an over-layer of and an under-layer of high melting point metal.
Figure 18B:
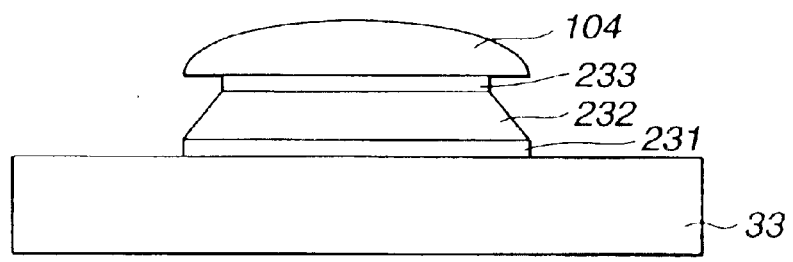
Figure 18C:
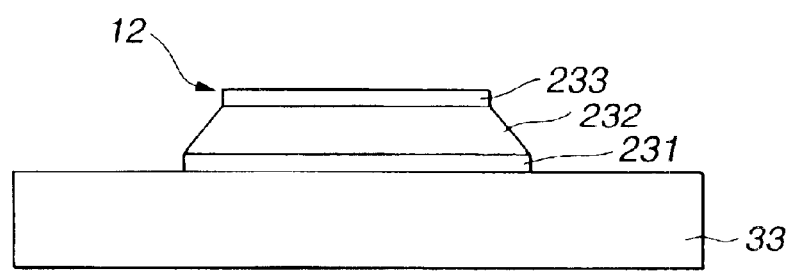

With reference to FIGS. 18(a), 18(b) and 18(c), an etching process for removing portions of a triple-layered film to form a signal line 12 is now described.

Referring to FIG. 18(a), the triple-layered film is formed on the gate dielectric layer 33. The triple-layered film includes an under-layer 231 of high melting point metal that is molybdenum (Mo), a middle-layer 232 of Al—Nd alloy that contains 0.5 wt % to 1.0 wt % Nd and an over-layer 233 of high melting point metal that is molybdenum (Mo). Photoresist 104 is applied to the surface of the over-layer 233 and formed into a desired pattern as shown in FIG. 18(a) by exposure and development.

Referring to FIG. 18(b), using the photoresist 104 as mask, wet etching is applied at temperature ranging from 40° C. to 50° C. to remove unmasked portions of the over-layer 233, middle-layer 232 and under-layer 231. A mixture of phosphoric acid ($H_3PO_4$), nitric acid ($HNO_3$) and acetic acid ($CH_3$—COOH) is the etchant used in this wet etching. The composition of the etchant is adjusted such that the etch rate of Mo is greater than the etch rate of Al—Nd. One example of the preferred ratio in mass % of phosphoric acid ($H_3PO_4$), nitric acid ($HNO_3$) and acetic acid ($CH_3$—COOH) is 72:4.4 to 5.4:8. Another example of such ratio is 74:4.2 to 5.2:6. The wet etching may be performed in shower mode with or without one of puddle mode and dip mode. As compared to the above-described etching process of the double-layered film to form the signal line, the etching process of the triple-layer film to form the signal line has less process margin. Particularly, the side etching of the under-layer 231 of Mo is prominent. Thus, etching conditions must be optimized accounting for the thickness of each of three layers 233, 232 and 231 of the triple-layered structure.

Referring to FIG. 18(c), the photoresist 104 is removed to provide the signal line 12.

Other etching process of a triple-layered film to form signal line will now be described in the case where molybdenum (Mo) or molybdenum alloy is used as high melting point metal.

With reference to FIGS. 19(a), 19(b), 19(c) and 19(d), an etching process for removing portions of a triple-layered film to form a signal line 12 is now described.

Figure 19A:
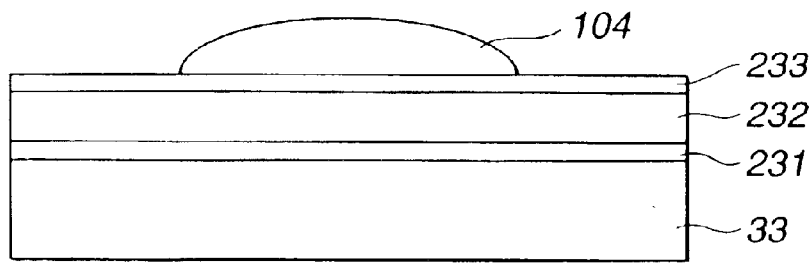
FIGS. 19(a), 19(b), 19(c) and 19(d) are schematic views of other etching process of removing portions of a triple-layered film to form a signal line if molybdenum (Mo) or molybdenum alloy is used as an over-layer of and an under-layer of high melting point metal.

Referring to FIG. 19(a), the triple-layered film is formed on the gate dielectric layer 33. The triple-layered film includes an under-layer 231 of high melting point metal that is molybdenum (Mo), a middle-layer 232 of Al—Nd alloy that contains 0.5 wt % to 1.0 wt % Nd and an over-layer 233 of high melting point metal that is molybdenum (Mo). Photoresist 104 is applied to the surface of the over-layer 233 and formed into a desired pattern as shown in FIG. 19(a) by exposure and development.

Figure 19B:
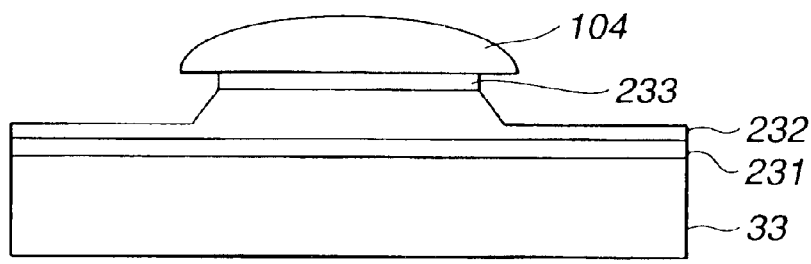

Referring to FIG. 19(b), using the photoresist 104 as mask, wet etching is applied at temperature ranging from 40° C. to 50° C. to remove unmasked portion of the over-layer 233 to expose the underlying middle-layer 232 and to etch the middle-layer 232 halfway to remove upper portion thereof. A mixture of phosphoric acid ($H_3PO_4$), nitric acid ($HNO_3$) and acetic acid ($CH_3$—COOH) is the etchant used in this wet etching. The composition of the etchant is adjusted such that the etch rate of Mo is greater than the etch rate of Al—Nd. One example of the preferred ratio in mass % of phosphoric acid ($H_3PO_4$), nitric acid ($HNO_3$) and acetic acid ($CH_3$—COOH) is 72: 4.4 to 5.4:8. Another example of such ratio is 74:4.2 to 5.2:6. The wet etching may be performed in any desired mode, such as shower mode or dip mode. However, shower mode with or without one of puddle mode and dip mode are preferred.

Figure 19C:
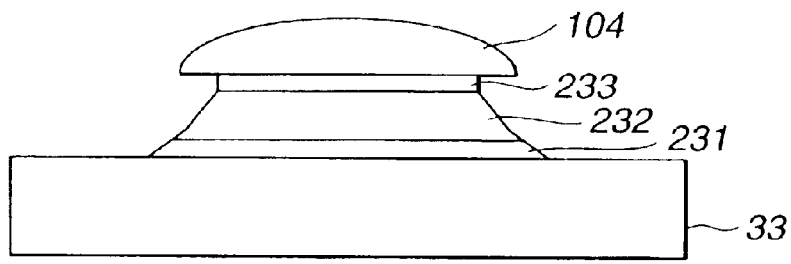

Referring to FIG. 19(c), subsequently, the remaining portion of the middle-layer 232 is removed by dry etching. Chlorine ($Cl_2$) and boron trichloride ($BCl_3$) are used as etchant gas. In the exemplary embodiment, reactive ion etching (RIE) is performed at pressure of 1.3 pa. The flow rate of $Cl_2$ is 60 sccm and the flow rate of $BCl_3$ 20 sccm. The distance between electrodes is 150 mm. Subsequently, using, as etching gas, chlorine ($Cl_2$) and oxygen ($O_2$), dry etching is applied to etch the under-layer 231. Two-step RIE is performed.

Figure 19D:
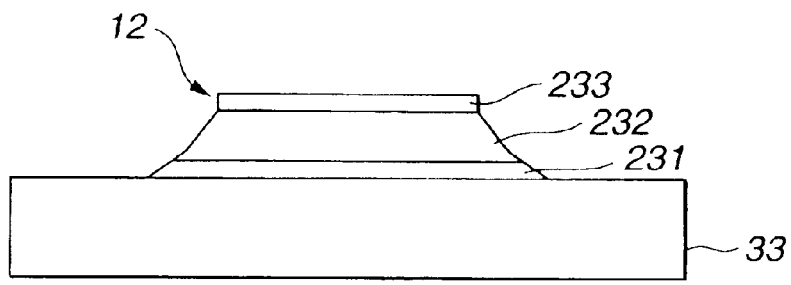

Referring to FIG. 19(d), the photoresist 104 is removed to provide the signal line 12.

Etching steps of a double-layered film and a triple-layered film to form scanning and signal lines will now be described in the case where one selected from a group including titanium (Ti), titanium nitride (TiN), tantalum (Ta), niobium (Nb), tungsten (W), titanium alloy, titanium nitride alloy, tantalum alloy, niobium alloy and tungsten alloy is used as high melting point metal.

Figure 20A:
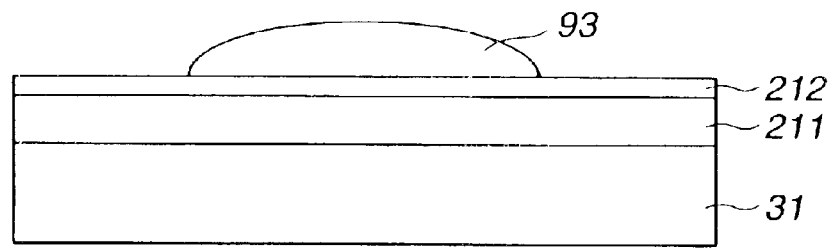
FIGS. 20(a), 20(b) and 20(c) are schematic views of removing portions of a double-layered film to form a scanning line if one selected from a group including titanium (Ti), titanium nitride (TiN), tantalum (Ta), niobium (Nb), tungsten (W), titanium alloy, titanium nitride alloy, tantalum alloy, niobium alloy and tungsten alloy is used as an over-layer of high melting point metal.
Figure 20B:
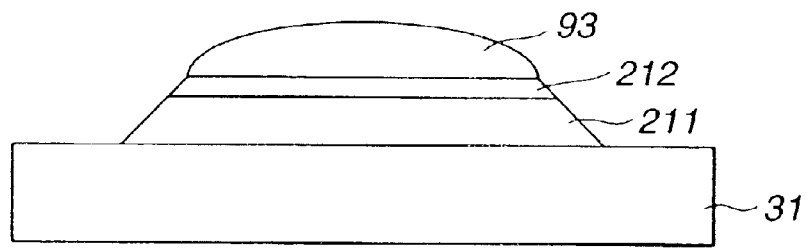
Figure 20C:
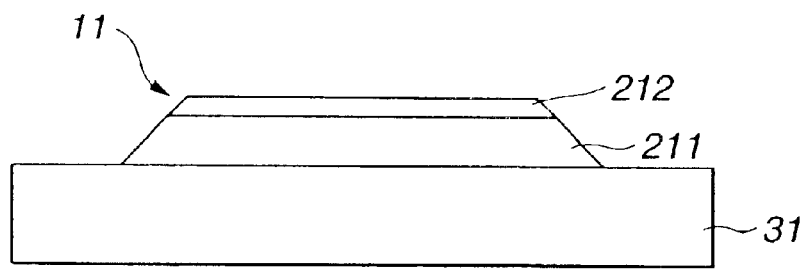

With reference to FIGS. 20(a), 20(b) and 20(c), an etching process for removing portions of a double-layered film to form a scanning line 11 is now described.

Referring to FIG. 20(a), the double-layered film is formed on the transparent substrate 31. The double-layered film includes an under-layer 211 of Al—Nd alloy and an over-layer 212 of high melting point metal. Photoresist 93 is applied to the surface of the over-layer 212 and formed into a desired pattern as shown in FIG. 20(a) by exposure and development.

Referring to FIG. 20(b), using the photoresist 93 as mask, dry etching is applied to remove unmasked portions of the over-layer 212 and under-layer 211. The preferred range of the concentration of Nd within Al—Nd alloy differs depending on which high melting point metal is used. The concentration of Nd within Al—Nd alloy ranges from 0.01 wt % to 1.00 wt % in the case where the high melting point metal contains Ti or Ta or Nb. However, in the case where the high melting point metal contains TiN or W, the concentration of Nd within Al—Nd alloy ranges from 0.5 wt % to 1.0 wt %. Etching gas differs depending on which high melting point is used. In the case where the high melting point metal is Ti or Ti-alloy or TiN or TiN-alloy, the high melting point metal and Al—Nd are etched using chlorine ($Cl_2$) and boron trichloride ($BCl_3$). In the exemplary embodiment, one-step reactive ion etching (RIE) is performed at pressure of 1.3 pa. The flow rate of $Cl_2$ is 60 sccm and the flow rate of $BCl_3$ 20 sccm. The distance between electrodes is 150 mm. In the case where the high melting point metal is Ta or Ta-alloy or Nb or Nb-alloy or W or W-alloy, two-step RIE is performed. As one step, the over-layer 212 of high melting point metal is etched by RIE using chlorine ($Cl_2$) and oxygen ($O_2$) or by RIE using carbon fluoride ($CF_4$) and oxygen ($O_2$), and, as another step, the under-layer 211 of Al—Nd is etched by RIE using chlorine ($Cl_2$) and boron trichloride ($BCl_3$).

Referring to FIG. 20(c), the photoresist 93 is removed to provide the scanning line 11.

Instead of the before described etching process including wet etching, the dry etching as described above may be used to etch a double-layered film including, as high melting point metal, Cr or Cr-alloy or Ho or Mo-alloy. In this case, such high melting point metal is dry etched using chlorine ($Cl_2$) and oxygen ($O_2$) as etchant gas.

Figure 21A:
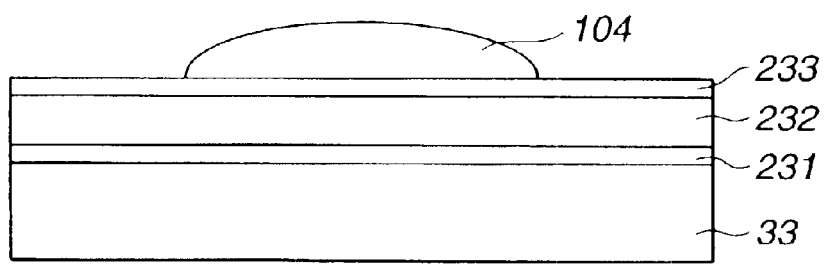
FIGS. 21(a), 21(b) and 21(c) are schematic views of is removing portions of a triple-layered film to form a signal line if one selected from a group including titanium (Ti), titanium nitride (TiN), tantalum (Ta), niobium (Nb), tungsten (W), titanium alloy, titanium nitride alloy, tantalum alloy, niobium alloy and tungsten alloy is used as an over-layer of and an under-layer of high melting point metal.
Figure 21B:
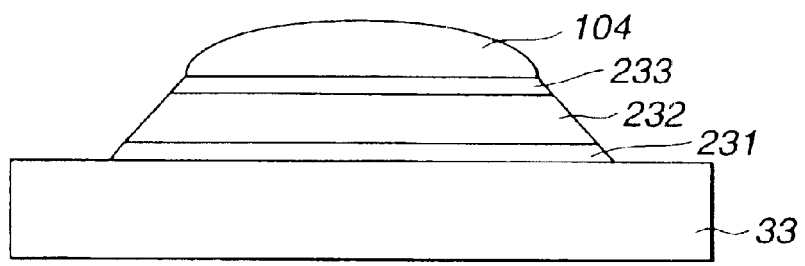
Figure 21C:
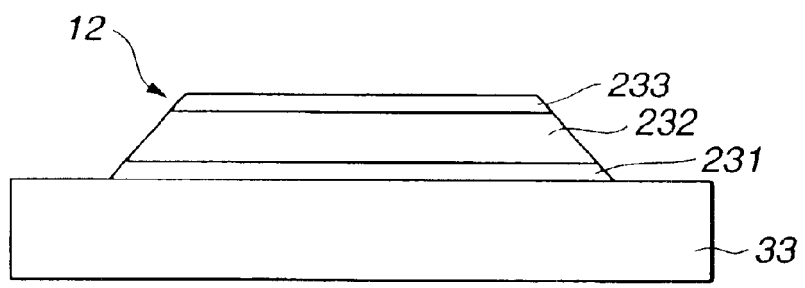

With reference to FIGS. 21(a), 21(b) and 21(c), an etching process for removing portions of a triple-layered film to form a signal line 12 is now described.

Referring to FIG. 21(a), the triple-layered film is formed on the gate dielectric layer 33. The triple-layered film includes an under-layer 231 of high melting point metal, a middle-layer 232 of Al—Nd alloy and an over-layer 233 of high melting point metal. Photoresist 104 is applied to the surface of the over-layer 233 and formed into a desired pattern as shown in FIG. 21(a) by exposure and development.

Referring to FIG. 21(b), using the photoresist 104 as mask, dry etching is applied to remove unmasked portions of the over-layer 233, middle-layer 232 and under-layer 231. The preferred range of the concentration of Nd within Al—Nd alloy differs depending on which high melting point metal is used. The concentration of Nd within Al—Nd alloy ranges from 0.01 wt % to 1.00 wt % in the case where the high melting point metal contains Ti or Ta or Nb. However, in the case where the high melting point metal contains TiN or W, the concentration of Nd within Al—Nd alloy ranges from 0.5 wt % to 1.0 wt %. Etching gas differs depending on which high melting point is used. In the case where the high melting point metal is Ti or Ti-alloy or TiN or TiN-alloy, the high melting point metal and Al—Nd are etched using chlorine ($Cl_2$) and boron trichloride ($BCl_3$). In the exemplary embodiment, one-step reactive ion etching (RIE) is performed at pressure of 1.3 pa. The flow rate of $Cl_2$ is 60 sccm and the flow rate of $BCl_3$ 20 sccm. The distance between electrodes is 150 mm. In the case where the high melting point metal is Ta or Ta-alloy or Nb or Nb-alloy or W or W-alloy, three-step RIE is performed. As first step, the over-layer 233 of high melting point metal is etched by RIE using chlorine ($Cl_2$) and oxygen ($O_2$) or by TIE using carbon fluoride ($CF_4$) and oxygen ($O_2$), as second step, the middle-layer 232 of Al—Nd is etched by RIE using chlorine ($Cl_2$) and boron trichloride ($BCl_3$) and, as third step, the under-layer 231 of high melting point metal is etched by RIE using chlorine ($Cl_2$) and oxygen ($O_2$) or by RIE using carbon fluoride ($CF_4$) and oxygen ($O_2$)Referring to FIG. 21(c), the photoresist 104 is removed to provide the signal line 12.

Instead of the before described etching process including wet etching, the dry etching as described above may be used to etch a triple-layered film including, as high melting point metal, Cr or Cr-alloy or Mo or Mo-alloy. In this case, such high melting point metal is dry etched using chlorine ($Cl_2$) and oxygen ($O_2$) as etchant gas.

As is readily understood from the preceding description in connection with FIGS. 15(a) to 21(c), the etching steps described above form scanning and signal lines having one desired tapered profile or another desired profile partially tapered leaving vertical sidewall portion.

Referring back to FIG. 6, an orientation film 39, which has about 50 nm thick, is printed on the active matrix substrate 10 and baked at temperature about 220° C. Another orientation film 39, which has about 50 nm thick, is printed on the color filter substrate 40 and baked at temperature about 220° C. The color filter substrate 40 includes color filters 42, black matrix 43 and common electrode 44, which are covered by the orientation film 39. The color filters 42 and black matrix 43 are formed on the transparent dielectric substrate 41. The color filters 42 are in opposed relationship with the pixel electrodes 27, respectively. The black matrix 43 surrounds the color filters 42 and extends in opposed relationship with the TFTs 13. A transparent conductive film of ITO makes the common electrode 44. With a spacer including seal 45 and plastic particles, the color filter substrate 40 is placed on the active matrix substrate 10 with their orientation films 39 in opposed spaced relationship. Liquid crystal is injected into the space between the substrates 10 and 40. After injection, an injection opening of the seal 45 is sealed by filler material. Polarizing plates 47 are applied to the opposite surfaces of the substrates 10 and 40 to complete a LCD. Subsequently, a tape carrier package (TCP) is pressed on scanning and signal line terminals 14 and 15 for operative connection with a driver circuit.

The preciously described etching steps for fabricating the first exemplary embodiment require five (5) sheets of mask or masking layers. As different from such etching steps, the etching steps for fabricating the second exemplary embodiment requires four (4) sheets of mask or masking layers.

Referring back to FIGS. 8(a)–8(d), 9(a)–9(d), and 10(a)–10(d), steps for fabricating the second exemplary embodiment of active matrix substrate 10 (see FIG. 7) are described. FIGS. 8(a), 9(a) and 10(a) illustrate one process of forming gate electrodes and scanning lines. FIGS. 8(b), 9(b) and 10(b) illustrate another process of forming gate dielectric film, source electrodes, drain electrodes, signal lines and semiconductor layer. FIGS. 8(c), 9(c) and 10(c) illustrate still another process of forming passivation film and contact holes. FIGS. 8(d), 9(d) and 10(d) illustrate other process of forming conductors. As is readily seen from FIGS. 8(a), 9(a) and 10(a), a double-layered film forms the gate electrodes and the scanning lines. The double-layered film includes an under-layer of Al—Nd alloy and an over-layer of high melting point metal. As is readily seen from FIGS. 8(b), 9(b) and 10(b), a triple-layered film includes an under-layer of high melting point metal, a middle-layer of Al—Nd alloy and an over-layer of high melting point metal.

In the process of FIGS. 8(a), 9(a) and 10(a), a sheet of no-alkali glass having 0.7 mm thick is used as the transparent substrate 31. A double-layered film is formed on the transparent substrate 31. The double-layered film includes an under-layer 211 of Al—Nd alloy and an over-layer 212 of high melting point metal. Sputtering is used to form the under-layer 211 of Al—Nd alloy on the surface of the transparent substrate 31. Subsequently, sputtering is used to form the over-layer 212 of high melting point metal on the under-layer 211. The under-layer 211 of Al—Nd has about 200 nm thick. The over-layer 212 of high melting point metal has about 100 nm thick. Removing, including photolithography and etching, portions of the double-layered film (211, 212) to form gate electrode 21, scanning lines, storage capacitor electrodes, light shielding layer, and underlying metallic film 32 of the scanning lines.

In the case where the over-layer 212 of the double-layered film is formed of a high melting point metal selected from a group consisting of chromium (Cr), titanium (Ti), tantalum (Ta), niobium (Nb), chromium alloy, titanium alloy, tantalum alloy, and niobium alloy, the concentration of neodymium (Nd) of the under-layer 211 ranges from 0.01 wt % to 1.00 wt %.

In the case where the over-layer 212 of the double-layered film is formed of a high melting point metal selected from a group consisting of molybdenum (Mo), tungsten (W), titanium nitride (TiN), molybdenum alloy, tungsten alloy, and titanium nitride alloy, the concentration of neodymium (Nd) of the under-layer 211 ranges from 0.5 wt % to 1.0 wt %.

In the preceding description, various manners of etching the double-layered film to form scanning line have been-made.

Appropriate one of such may be used to etch the double-layered film in this exemplary embodiment.

In the process of FIGS. 8(b), 9(b) and 10(b), using plasma CVD, a gate dielectric film 33 of silicon nitride is formed to the thickness of about 400 nm, a layer 221 of amorphous silicon (a-Si) is formed to the depth of about 200 nm and a layer 222 of phosphorus-doped (P-doped) n-type amorphous silicon ($n^+$a-Si) is formed to the depth of about 30 nm. Subsequently, a triple-layered film is formed. Using sputtering, an under-layer 231 of high melting point metal is formed to the thickness of about 50 nm, a middle-layer 232 of Al—Nd alloy is formed to the thickness of about 200 nm and an over-layer 233 of high melting point metal is formed to the thickness of about 100 nm. Photolithography and etching are used to form source electrodes 23, drain electrodes 24, signal lines 12 and underlying metallic film 34 of the signal lines.

In the case where the under and over layers 231 and 233 of the triple-layered structure are formed of a high melting point metal selected from a group consisting of chromium (Cr), titanium (Ti), tantalum (Ta), niobium (Nb), chromium alloy, titanium alloy, tantalum alloy, and niobium alloy, the concentration of neodymium (Nd) of the middle-layer 232 ranges from 0.01 wt % to 1.00 wt %.

In the case where the under and over layers 231 and 233 of the triple-layered structure are formed of a high melting point metal selected from a group consisting of molybdenum (Mo), tungsten (W), titanium nitride (TiN), molybdenum alloy, tungsten alloy, and titanium nitride alloy, the concentration of neodymium (Nd) of the middle-layer 232 ranges from 0.5 wt % to 1.0 wt %.

As different from the previously described etching steps for fabricating the first exemplary embodiment, the source and drain electrodes 23, 24 and semiconductor layer 22 are formed in one process. With reference to FIGS. 8(b)-1 to 8(b)-5, 9(b)-1 to 9(b)-5, and 10(b)-1 to 10(b)-5, this will be explained below.

FIGS. 8(b)-1, 9(b)-i and 10(b)-i illustrate a tripled-layered structure of gate dielectric film 33 of silicon nitride, layer 221 of amorphous silicon (a-Si) and layer 222 of phosphorus-doped (P-doped) n-type amorphous silicon ($n^+$a-Si). Formed over the triple-layered structure is the triple-layered film including under-layer 231 of high melting point metal, middle-layer 232 of Al—Nd alloy and over-layer 233 of high melting point metal. Photoresist is applied to the surface of the over-layer 233 to the same depth and exposed, using a halftone mask or a graytone mask, to yield a desired three-dimensional (3-D) surface profile. In this example, the desired 3-D surface profile includes a protrusion with a clear window over an area where a channel of a TFT of each pixel region is to be etched. The photoresist with such desired 3-D profile is indicated at 61.

Referring to FIGS. 8(b)-2, 9(b)-2 and 10(b)-2, using the photoresist 61 as a mask, unmasked portions of the over-layer 231 of high melting point metal, middle-layer 232 of Al—Nd and under-layer 231 of high melting point metal are removed by etching. Any appropriate one of the previously described etching techniques to etch the triple-layered film may be applied.

Referring to FIGS. 8(b)-3, 9(b)-3 and 10(b)-3, in the process using oxygen plasma, thin planar portions of the photoresist 61 excluding the protrusions are removed by ashing. The remaining photoresist consisting of such protrusions is indicated at 62.

Referring to FIGS. 8(b)-4, 9(b)-4 and 10(b)-4, N-methyl-2-pyrrolidone (NMP) in vapor is used for reflowing of the remaining photoresist 62 such that the clear window of each protrusion is completely filled as indicated at 63. Using this photoresist 63, source and drain electrodes, signal lines 12 and the underlying metallic film 34 of the signal line terminal portions as a mask, the $n^+$a-Si layer 222 and a-Si layer 221 are removed by dry etching. The use of hydrochloric acid (HCl) must be prohibited as an element of etchant gas. The etchant gas may be one selected from a family of fluoride-based gas. The etchant gas may be a mixture of one selected from the family of fluoride-based gas and another selected from a family of chloride-based gas. In the exemplary embodiment, the family of chloride-based gas excludes HCl. One example of such etchant is a mixture gas of sulfur hexafluoride ($SF_6$), chloride ($Cl_2$) and hydrogen ($H_2$). Using this mixture gas as etchant, the etching may be performed (one step etching). Another and other examples are a first mixture gas of methane trifluoride ($CHF_3$), oxygen ($O_2$) and helium (He), and a second mixture gas of $SF_6$ and He, respectively. Using the first and second mixture gases, the etching may be performed in two steps. In the exemplary embodiment, the etching is applied in RIE mode.

Referring to FIGS. 8(b)-s, 9(b)-5 and 10(b)-5, after removing the photoresist 63, using the source and drain electrodes 23 and 24 as a mask, the $n^+$a-Si layer 222 between them is etched in RIE mode using the etchant gas described above. The etching of the $n^+$a-Si layer 222 and a-Si layer 221 without relying on HCL prevents corrosion of Al—Nd alloy.

Referring back to FIGS. 8(c), 9(c) and 10(c), plasma CVD is used to deposit a film of silicon nitride (SiN) over the entire surface of the underlying structure as the passivation film 35. The passivation film 35 has about 200 nm thick. Using photolithography and etching, pixel contact holes 36 and terminal contact holes 37 are formed through the passivation film 35.

Referring to FIGS. 8(c), 9(c) and 10(c), sputtering is used to deposit a film of indium tin oxide (ITO) or indium zinc oxide (IZO) as a transparent conductive film. The transparent conductive film has about 50 nm thick. Photolithography and etching on the transparent conductive film result in forming pixel electrode 27 and connecting electrodes 38 of the terminals. Oxalic acid ($C_2H_2O_4$) is used in etching the transparent conductive film. Since such weak acid as oxalic acid is used, the underlying Al—Nd is prevented from being damaged during the etching of such transparent conductive film of ITO or IZO. If ITO is to be deposited to form a transparent conductive film, simultaneously with introduction of argon (Ar) and oxygen, water is introduced into a process chamber of sputtering equipment to create, within the chamber, atmosphere-containing water at partial water pressure ranging from $2\times10^{-3}$ pa to $5\times10^{-2}$ pa, and ITO is deposited by DC magnetron sputter to form a film. During this sputtering, the substrate is processed at room temperature so that heating of the substrate is not needed. This makes it possible to use oxalic acid in etching the transparent conductive film. Besides, this suppresses an increase in electrical contact resistance between the transparent conductive film and the underlying metallic film.

At about relatively low temperature of 270° C. the damages due to sputtering are removed by annealing to complete the active matrix substrate 10.

The subsequent steps to fabricate an LCD are the same as those explained with reference to FIG. 6.

The preceding description has focused on fabrications of active matrix substrate having a matrix array of inverted staggered channel etch type TFTs. Fabrication of an active matrix substrate having a matrix array of inverted staggered TFTs of the channel protective type is described below.

Referring to FIGS. 12(a)–12(e), 13(a)–13(e) and 14(a)–14(e), fabrication of the third exemplary embodiment of an active matrix substrate 10 (see FIG. 11) is described. FIGS. 12(a), 13(a) and 14(a) illustrate one process of forming gate electrodes and scanning lines. FIGS. 12(b), 13(b) and 14(b) illustrate another process of forming gate dielectric film, an amorphous silicon (a-Si) layer and a channel protective film. FIGS. 12(c), 13(c) and 14(c) illustrate still another process of forming source electrodes, drain electrodes, signal lines and semiconductor layer. FIGS. 12(d), 13(d) and 14(d) illustrate further process of forming passivation film and contact holes. FIGS. 12(e), 13(e) and 14(e) illustrate other process of forming pixel electrodes.

The fabrication of the third exemplary embodiment is substantially the same as the fabrication of the second exemplary embodiment described above in connection with FIGS. 8(a) to 10(d) except the step illustrated in FIGS. 12(b), 13(b) and 14(b) of forming, within each of pixel regions, a channel protective film 71 on an amorphous silicon (a-Si) layer 221 as opposed to the underlying gate electrode 21.

Figure 22:
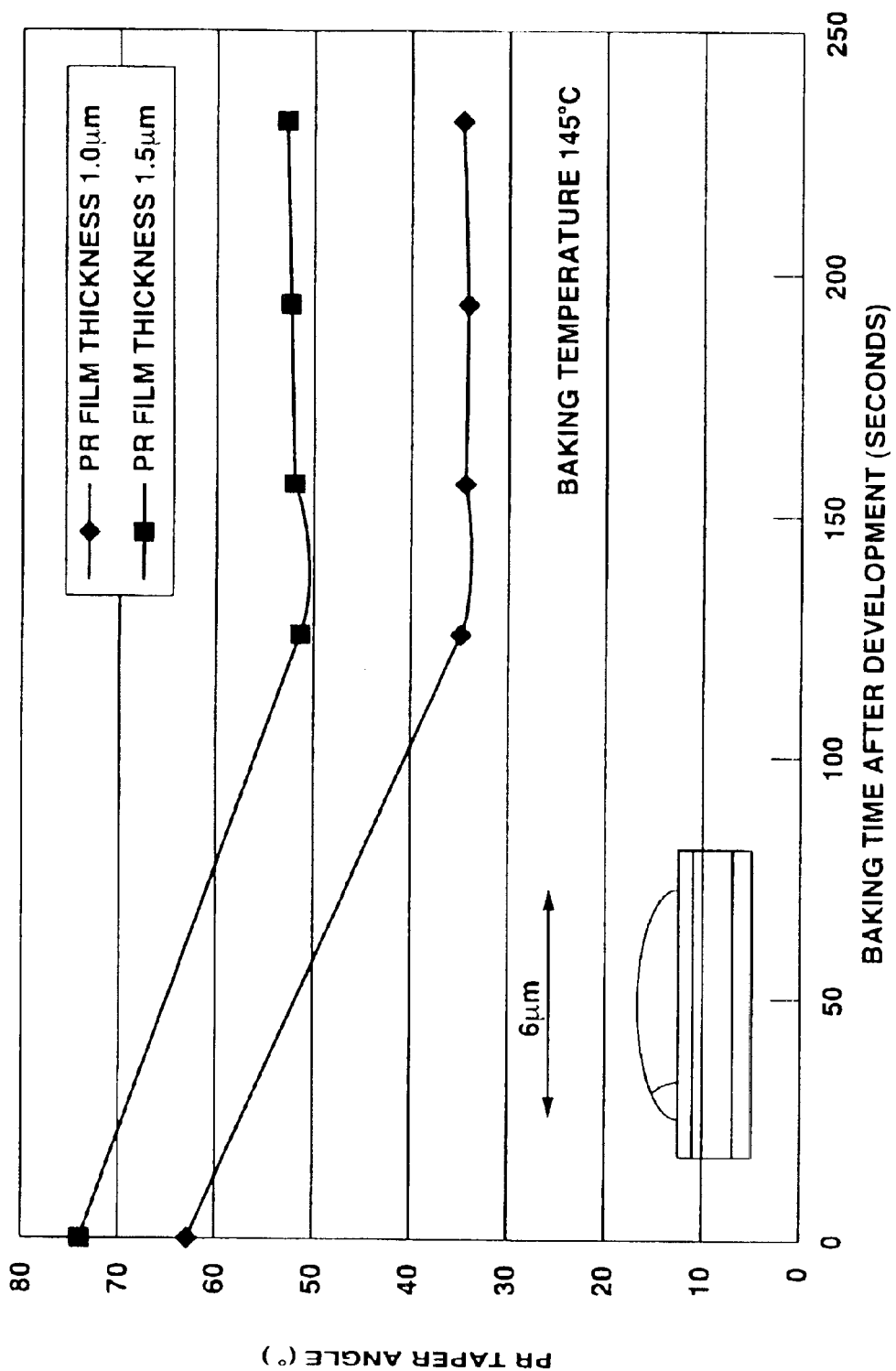
FIG. 22 is a graph showing taper angle (or side angle) of two different strips of photoresist as a function of baking times after development at a baking temperature of 145° C.

With reference to FIG. 22, for each of samples of two different strips of photoresist we made taper angle measurements. The results are presented in FIG. 22 for one strip of photoresist (PR) having 6 μm width and 1.0 μm film thickness and other strip of photoresist having 6 μm width and 1.5 μm film thickness. Each curve in FIG. 22 represents the taper angles as a function of baking times at a temperature of 145° C. after development. One can see that, for each curve, the taper angle decreases as the baking time increases and levels off upon and after the baking time exceeds about 120 seconds. The taper angle becomes about 33° if the thickness is 1.0 μm. The taper angle becomes about 53° if the thickness is 1.5 μm. The narrower the thickness is, the smaller angle the taper angle becomes. As mentioned before in connection with the step as illustrated in FIG. 16(d), the smaller the taper angle is, the quickly the photoresist loses volume due to ashing by $O_2$. However, the narrower the width is, the larger angle the taper angle becomes. Particularly, if the width is less than 6 μm, it is preferred to adjust the taper angle within a range from 30° to 35° by reducing the thickness sufficiently. The reduction to the thickness of 1.0 μm is preferred. For example, with the width of 16 μm, the thickness of 1.5 μm may be used because the taper angle of 35° is provided. After analysis we made on the taper angle of the photoresist, we confirmed that the range from 30° to 55° is preferred and the range from 30° to 35° was more preferred.

With reference to FIG. 23, for each of samples we made evaluations in terms of hillock, specific resistivity and dry etching residue. Each sample was a double-layered film including an over-layer of high melting point metal and an under-layer of Al—Nd. The over-layer has 100 nm thick, and the under-layer 250 nm thick. The samples differ one after another in variations in high melting point metal and concentration of Nd. They are dry etched under the conditions described before and annealed at 270° C. for 30 minutes. The results are presented in FIG. 23. In the legend used in FIG. 23 to indicate results of evaluating the level of hillock, ○: No hillock observed X: Hillocks observed.

In the legend used in FIG. 23 to indicate results of evaluating the level of dry etching residue, ○: No residue observed;

Δ: Little residue observed;

X: Considerable residue observed.

In FIG. 23, the evaluation results we made are arranged against different concentrations of Nd including 0.01 wt %, 0.1 wt %, 0.5 wt %, 1.0 wt % and 2.0 wt %. One can see that, with the high melting point metal being Cr or Ti or Ta or Nb, no hillock was observed for the Nd concentrations equal to and greater than 0.01 wt %. One can also see that, with the high melting point metal being Mo or W or TiN, no hillock was observed for the Nd concentrations equal to or greater than 0.5 wt %. Further, one can see that no residue was observed for the Nd concentrations within the range from 0.01 wt % to 0.1 wt %. One can also see that little residue was observed for the Nd concentrations within the range from 0.5 wt % to 1.0 wt %. This level of residue is negligible, causing no problem. One can further see that considerable residue was observed for the Nd concentration as high as 2.0 wt %. After analysis we made, we confirmed that the Nd concentrations within the range from 0.01 wt % to 1.0 wt % were preferred when the high melting point metal was Cr or Ti or Ta or Nb. However, the Nd concentrations within the range from 0.01 wt % to 0.1 wt % were more preferred. We also confirmed that the Nd concentrations within the range from 0.5 wt % to 1.0 wt % were preferred when the high melting point metal was No or W or TiN.

With reference to FIG. 24, for each of samples we made post etching shape evaluation in terms of side etching. Each sample was a triple-layered film including an over-layer of Mo, a middle-layer of Al—Nd and an under-layer of Mo, which was of the same specifications as that used in the wet etching described in connection with FIGS. 18(a) to 18(c). They were wet etched using, as etchant, different ratios in mass % of phosphoric acid ($H_3PO_4$), nitric acid ($HNO_3$) and acetic acid ($CH_3$—COOH). Concentration of nitric acid ($HNO_3$) was varied with the ratio of phosphoric acid ($H_3PO_4$) and acetic acid ($CH_3$—COOH) fixed 72:8 or 74:6. The results are presented in FIG. 24. In the legend used in FIG. 24 to indicate results of evaluating side etching of the under-layer of Mo.

◯: No side etching observed;

X: Side etching observed.

In FIG. 24, the evaluation results we made are arranged against different concentrations of $HNO_3$. One can see that, with ($H_3PO_4$):($CH_3$—COOH)=72:8, no side etching was observed in the under-layer of Mo for the concentrations of $HNO_3$ within the range from 4.4 wt % to 5.4 wt %. One can also that, with ($H_3PO_4$):($CH_3$—COOH)=74:6, no side etching was observed in the under-level layer of Mo for the concentrations of $HNO_3$ within the range from 4.4 wt % to 5.2 wt %. With the ratio ($H_3PO_4$):($CH_3$—COOH) fixed, the concentration of $HNO_3$ were varied because the etch rate of Mo was almost two-times as great as the etch rate of Al—Nd in any of the selected compositions of acid. Such compositions of acid were made based on the confirmation we made that the difference in electric potential between the Mo layer and the Al—Nd layer during etching caused considerable side etching of the Al—Md layer if the etch rate of Mo is almost equal to the etch rate of Al-Md. Thus, the different concentrations of $HNO_3$ were examined in a direction of reducing from its upper limit that was determined if ($H_3PO_4$):($CH_3$—COOH) was fixed. The upper limit is 5.5 wt % if ($H_3PO_4$):($CH_3$—COOH)=72:8. The upper limit is 5.3 wt % if ($H_3PO_4$):($CH_3$—COOH)=74:6.

With reference to FIG. 25, for each of samples we made evaluation in terms of levels of contact resistivity and wet etching residue. As preciously described in connection with FIGS. 3(e), 4(e) and 5(e), in each sample, sputtering was used to deposit a film of ITO as a transparent conductive film and oxalic acid ($C_2H_2O_4$) was used in etching the transparent film. In sputtering of the transparent film of ITO, water is introduced into the process chamber at different partial pressures. The results are presented in FIG. 25. In the legend used in FIG. 25 to indicate results of evaluating the contact resistivity, ◯: No increase in contact resistivity from the level due to sputtering without any introduction of water ($H_2O$);

Δ: A small increase in contact resistivity from the level due to sputtering without any introduction of water ($H_2O$);

X: A considerable increase in contact resistivity from the level due to sputtering without any introduction of water ($H_2O$).

The above-mentioned same legend was used in FIG. 25 to indicate results of evaluating wet etching residue in the same manner as used in FIG. 23 before in indicating results of evaluating dry etching residue.

One can see that, with the water partial pressures equal to or less than $2 \times 10^{-3}$ pa, there was no increase in contact resistivity from the level due to sputtering without any introduction of water. We confirmed that as the water partial pressure increased beyond $2 \times 10^{-3}$ pa, the contact resistivity gradually increased. We also confirmed that the contact resistivity increased rapidly when the water partial pressure exceeded $5 \times 10^{-2}$ pa. Increase in two digits, in contact resistivity, occurred at the water partial pressure of $7 \times 10^{-2}$ pa.

With regard to wet etching residue, one can see that, with the water partial pressures equal to or greater than $2 \times 10^{-3}$ pa, no residue was observed. One can also see that, at water partial pressure of $6 \times 10^{-4}$ pa, residue was observed. After analysis, we confirmed that the water partial pressures within the range from $2 \times 10^{-3}$ pa to $5 \times 10^{-2}$ pa were pressure in sputtering of ITO film.

From the preceding description, it will be appreciated that, in each of exemplary implementations of the present invention, the concentration of Nd that is adjusted depending the associated high melting point metal effectively suppress occurrence of hillocks in the process of fabrication of an active matrix substrate.

While the present invention has been particularly described, in conjunction with exemplary embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

This application claims the priority of Japanese Patent Application No. P2001-150092, filed May 18, 2001, the disclosure of which is hereby incorporated by reference in its entirety.

What is claimed is:

1. An active matrix substrate, comprising:
    a substrate;
    a matrix array of thin film transistors (TFTs) disposed within a display area on said substrate;
    a double-layered film including an under-layer of aluminum-neodymium (Al—Nd) alloy and an over-layer of high melting point metal, said double-layered film forming first anisotropically dry-etched interconnection lines for connection to said TFTs; and
    a triple-layered film including an under-layer of said high melting point metal, a middle-layer of said Al—Nd alloy and an over-layer of said high melting point metal, said triple-layered film forming second anisotropically dry-etched interconnection lines for connection to said TFTs, wherein said Al—Nd alloy contains less than about 1.00 wt % neodymium (Nd).

2. The active matrix substrate as claimed in claim 1, wherein said high melting point metal is selected from a group consisting of chromium (Cr), titanium (Ti), tantalum (Ta), niobium (Nb), chromium alloy, titanium alloy, tantalum alloy, and niobium alloy; and wherein said Al—Nd alloy contains 0.01 wt % to less than about 1.00 wt % neodymium (Nd).

3. The active matrix substrate as claimed in claim 1, wherein said high melting point metal is selected from a group consisting of molybdenum (Mo), tungsten (W), titanium nitride (TiN), molybdenum alloy, tungsten alloy, and titanium nitride alloy; and wherein said Al—Nd alloy contains 0.5 wt % to less than about 1.0 wt % neodymium (Nd).

4. The active matrix substrate of claim 1, wherein said first interconnection lines are scanning lines connected to gate electrodes.

5. The active matrix substrate of claim 4, wherein said double-layered film is patterned to form the gate electrodes.

6. The active matrix substrate of claim 5, wherein said second interconnection lines are signal lines connected to drain electrodes.

7. The active matrix substrate of claim 6, wherein said triple-layered film is patterned to form the drain electrodes.

8. The active matrix substrate of claim 1, wherein said triple-layered film is formed on a laminated semiconductor layer.

9. The active matrix substrate of claim 8, wherein said triple-layered film is formed above said double-layered film.

10. The active matrix substrate of claim 9, further comprising:
a gate dielectric layer formed on said double-layered film.

11. The active matrix substrate of claim 10, wherein said triple-layered film is patterned to form drain electrodes of said TFTs and an assembly of said second interconnection lines which are signal lines connected to said drain electrodes, and said double-layered film is patterned to form gate electrodes of said TFTs and an assembly of said first interconnection lines which are scanning lines connected to said gate electrodes.

12. The active matrix substrate of claim 11, further comprising:
a laminated semiconductor layer formed on said gate dielectric layer.

13. The active matrix substrate of claim 12, comprising source and drain electrodes that extend beyond sidewalls of said laminated semiconductor layer so that sidewalls of source and drain electrodes do not vertically align with the sidewalls of the laminated semiconductor layer.

14. The active matrix substrate of claim 12, wherein sidewalls of source and drain electrodes vertically align with sidewalls of said laminated semiconductor layer.

15. The active matrix substrate of claim 14, wherein said matrix array includes inverted staggered channel etch type TFTs.

16. The active matrix substrate of claim 14, wherein said matrix array includes inverted staggered channel protective type TFTs.

17. The active matrix substrate of claim 12, wherein said triple-layered film is formed on top of said gate dielectric layer.

18. The active matrix substrate of claim 12, wherein said laminated semiconductor layer includes an amorphous silicon layer.

19. The active matrix substrate of claim 18, wherein a channel protective film is formed on top of said amorphous silicon layer.

20. The active matrix substrate of claim 19, wherein said laminated semiconductor layer includes said amorphous silicon layer as an underlayer upon which is formed a phosphorus-doped n-type amorphous silicon over-layer.

21. The active matrix substrate of claim 18, wherein said laminated semiconductor layer includes said amorphous silicon layer as an underlayer upon which is formed a phosphorus-doped n-type amorphous silicon over-layer.

22. The active matrix substrate of claim 12, wherein said triple-layer film is further patterned to form source electrodes and wherein one of said source electrodes and one of said drain electrodes are separated from each other and formed on said laminated semiconductor layer.

23. The active matrix substrate of claim 1, wherein each of said TFTs is positioned near one of a number of crossing points of said first interconnection lines and said second interconnection lines.

24. The active matrix substrate of claim 23, further comprising at least one pixel electrode formed within a rectangular area defined by a portion of said first interconnection lines and a portion of said second interconnection lines.

25. An active matrix substrate, comprising:
a substrate;
a matrix array of thin film transistors (TFTs) disposed within a display area on said substrate;
a double-layered film including an under-layer of aluminum-neodymium (Al—Nd) alloy and an over-layer of high melting point metal, said double-layered film forming first anisotropically dry-etched interconnection lines for connection to said TFTs; and
a triple-layered film including an under-layer of said high melting point metal, a middle-layer of said Al—Nd alloy and an over-layer of said high melting point metal, said triple-layered film forming second anisotropically dry-etched interconnection lines for connection to said TFTs, wherein said high melting point metal is selected from a group consisting of niobium (Nb), titanium alloy, tantalum alloy, and niobium alloy, and wherein said Al—Nd alloy contains 0.01 wt % to 1.00 wt % neodymium (Nd).

26. An active matrix substrate, comprising:
a substrate;
a matrix array of thin film transistors (TFTs) disposed within a display area on said substrate;
a double-layered film including an under-layer of aluminum-neodymium (Al—Nd) alloy and an over-layer of high melting point metal, said double-layered film forming first anisotropically dry-etched interconnection lines for connection to said TFTs; and
a triple-layered film including an under-layer of said high melting point metal, a middle-layer of said Al—Nd alloy and an over-layer of said high melting point metal, said triple-layered film forming second anisotropically dry-etched interconnection lines for connection to said TFTs, wherein said high melting point metal is selected from a group consisting of titanium nitride (TiN), tungsten alloy, and titanium nitride alloy; and wherein said Al—Nd alloy contains 0.5 wt % to 1.0 wt % neodymium (Nd).

27. A liquid crystal display comprising:
an active matrix substrate including:
a double-layered film comprising an under-layer of aluminum-neodymium (Al—Nd) alloy and an over-layer of high melting point metal, said double-layered film forming first anisotropically dry-etched interconnection lines; and
a triple-layered film comprising an under-layer of said high melting point metal, a middle-layer of said Al—Nd alloy and an over-layer of said high melting point metal, said triple-layered film forming second anisotropically dry-etched interconnection lines, wherein said Al—Nd alloy contains less than about 1.00 wt % neodymium (Nd);
a color filter substrate; and
liquid crystal interposed between said active matrix substrate and the color filter substrate.

28. The liquid crystal display of claim 27, wherein said triple-layered film forms second anisotropically dry etched interconnection lines for connection to TFTs, and said double-layered film forms first anisotropically dry etched interconnection lines for connection to said TFTs.

29. The liquid crystal display of claim 28, wherein an orientation film is formed on the active matrix substrate and on the color filter substrate.

30. The liquid crystal display of claim 29, wherein said color filter substrate includes a transparent dielectric substrate, color filters, a black matrix, and a common electrode.

31. The liquid crystal display of claim 30, including polarizing plates on said color filter substrate and said active matrix substrate.

32. An active matrix substrate, comprising:

a substrate;

a matrix array of thin film transistors (TFTs) disposed within a display area on said substrate;

a double-layered film including an under-layer of aluminum-neodymium (Al—Nd) alloy and an over-layer of high melting point metal, said double-layered film forming first anisotropically dry-etched interconnection lines for connection to said TFTs; and a triple-layered film including an under-layer of said high melting point metal, a middle-layer of said Al—Nd alloy and an over-layer of said high melting point metal, said triple-layered film forming second anisotropically dry-etched interconnection lines for connection to said TFTs, wherein said Al—Nd alloy has a neodymium (Nd) concentration that falls in a predetermined range established for dry etching in forming the first and second anisotropically dry-etched interconnection lines.

33. The active matrix substrate as claimed in claim 32, wherein said high melting point metal is selected from a group consisting of chromium (Cr), titanium (Ti), tantalum (Ta), niobium (Nb), chromium alloy, titanium alloy, tantalum alloy, and niobium alloy; and wherein said Al—Nd alloy contains 0.01 wt % to 1.00 wt % neodymium (Nd).

34. The active matrix substrate as claimed in claim 32, wherein said high melting point metal is selected from a group consisting of molybdenum (Mo), tungsten (W), titanium nitride (TiN), molybdenum alloy, tungsten alloy, and titanium nitride alloy; and wherein said Al—Nd alloy contains 0.5 wt % to 1.0 wt % neodymium (Nd).

35. The active matrix substrate of claim 32, wherein said first interconnection lines are scanning lines connected to gate electrodes.

* * * * *